US012486561B2

(12) United States Patent
Ikeda et al.

(10) Patent No.: US 12,486,561 B2
(45) Date of Patent: Dec. 2, 2025

(54) HARD COATING

(71) Applicant: SEAVAC, INC., Amagasaki (JP)

(72) Inventors: Yuta Ikeda, Amagasaki (JP); Yoshinobu Yano, Amagasaki (JP); Tomoko Amano, Amagasaki (JP); Rabie Benioub, Amagasaki (JP); Shinichiro Sato, Amagasaki (JP)

(73) Assignee: SEAVAC, INC.

( * ) Notice: Subject to any disclaimer, the term of this patent is extended or adjusted under 35 U.S.C. 154(b) by 0 days.

(21) Appl. No.: 18/837,568

(22) PCT Filed: Dec. 22, 2022

(86) PCT No.: PCT/JP2022/047417
§ 371 (c)(1),
(2) Date: Feb. 25, 2025

(87) PCT Pub. No.: WO2023/157466
PCT Pub. Date: Aug. 24, 2023

(65) Prior Publication Data

US 2025/0215550 A1 Jul. 3, 2025

(30) Foreign Application Priority Data

Feb. 15, 2022 (JP) ................................ 2022-021468

(51) Int. Cl.
*C23C 14/06* (2006.01)
*C23C 14/32* (2006.01)

(52) U.S. Cl.
CPC ........ *C23C 14/0641* (2013.01); *C23C 14/325* (2013.01)

(58) Field of Classification Search
None
See application file for complete search history.

(56) References Cited

U.S. PATENT DOCUMENTS 6,296,928 B1 10/2001 Yamada et al.
6,824,601 B2 11/2004 Yamamoto et al.
(Continued)

FOREIGN PATENT DOCUMENTS

JP 4-337064 A 11/1992
JP 8-165558 A 6/1996
(Continued)

OTHER PUBLICATIONS

International Search Report in PCT/JP2022/047417, dated Mar. 20, 2023.
Chang. Yin-Yu et al. Coatings. Jun. 28, 2020. vol. 10. pp. 605-1 to 605-17. doi: 10.3390/ coatings10070605.

*Primary Examiner* — Seth Dumbris
(74) *Attorney, Agent, or Firm* — Global IP Counselors, LLP

(57) ABSTRACT

A hard coating is provided that comprises a lower layer having a composition composed of (Ti, Al)N or (Ti, Al, Mo)N, an intermediate layer formed on the lower layer, and an upper layer formed on the intermediate layer and having a composition composed of (Al, Ti, Cr, M)N. The M represents one or more elements selected from Mo, V, and Y. The intermediate layer has a substantial composition composed of (Al, Ti, Cr, M)N and has the composition between the composition of the lower layer and the composition of the upper layer, each of an atomic proportion of Al, an atomic proportion of Ti, and an atomic proportion of M changes in a film thickness direction from a side of the lower layer toward a side of the upper layer, and an atomic proportion of Cr is larger as closer to the side of the upper layer in the film thickness direction.

7 Claims, 7 Drawing Sheets

(56) References Cited

U.S. PATENT DOCUMENTS

| | | | | |
|---|---|---|---|---|
| 6,919,288 | B2 | 7/2005 | Yamamoto et al. | |
| 7,166,155 | B2 | 1/2007 | Ishikawa | |
| 7,186,324 | B2 | 3/2007 | Yamamoto et al. | |
| 7,435,487 | B2 | 10/2008 | Ishikawa | |
| 8,475,941 | B2 | 7/2013 | Yamamoto | |
| 8,741,114 | B2 | 6/2014 | Yamamoto | |
| 2007/0141346 | A1 * | 6/2007 | Nordlof | C22C 29/08 428/408 |
| 2007/0218242 | A1 * | 9/2007 | Moriguchi | C23C 30/005 428/409 |
| 2007/0269610 | A1 * | 11/2007 | Fukui | C23C 14/0641 427/497 |
| 2018/0073124 | A1 * | 3/2018 | Nii | C23C 16/347 |

FOREIGN PATENT DOCUMENTS

| | | | |
|---|---|---|---|
| JP | 2644710 | B2 | 8/1997 |
| JP | 2840541 | B2 | 12/1998 |
| JP | 3248897 | B2 | 1/2002 |
| JP | 3640310 | B2 | 4/2005 |
| JP | 3836640 | B2 | 10/2006 |
| JP | 4112834 | B2 | 7/2008 |
| JP | 4475230 | B2 | 6/2010 |
| JP | 4745243 | B2 | 8/2011 |
| JP | 2012-228735 | A | 11/2012 |
| JP | 5193153 | B2 | 5/2013 |
| JP | 5730535 | B2 | 6/2015 |
| JP | 6347566 | B1 | 6/2018 |
| JP | 2021-154415 | A | 10/2021 |

* cited by examiner

HARD COATING

CROSS-REFERENCE TO RELATED APPLICATIONS

This application is a U.S. National stage of International Application No. PCT/JP2022/047417 filed on Dec. 22, 2022. This application claims priority to Japanese Patent Application No. 2022-021468 filed on Feb. 15, 2022 with Japan Patent Office. The entire disclosure of Japanese Patent Application No. 2022-021468 is hereby incorporated herein by reference.

BACKGROUND

Field of the Invention

The present invention relates to a hard coating formed on a substrate.

Background Information

To improve durability of a press die, a cutting tool, etc., a press die and a cutting tool coated with a nitride such as TiN, TiAlN, and CrAlN have been practically used. In recent years, it has become more difficult to cut and process a workpiece to be processed with these press dies, cutting tools, etc., and also the processing conditions have been required to be highly efficient. Thus, the press die and the cutting tool have been required to achieve longer lifetime without shortening the lifetime even in processing under severer processing conditions. A hard coating formed on a surface of the press die and the cutting tool has been required to have higher performance of durability.

As for the coating performance of the durability, wear resistance and heat resistance are important. High wear resistance refers to little wear of the hard coating in cutting processing or pressing processing with the die. High heat resistance refers to little oxidation on a surface at higher temperature when the die or the cutting tool becomes hot in processing. In addition, the coating performance includes high welding resistance and a low frictional coefficient, which affect improvement of surface properties and removability of a workpiece in processing.

To improve the heat resistance, properties of a TiAlN single layer film is investigated (see JP 2644710 B (Patent Literature 1), for example), and considering a substrate, a TiAlN coating and a CrAlN coating are compared (see JP 4475230 B (Patent Literature 2), for example). For a purpose of improving the heat resistance, there are a Tiran coating (see JP 4112834 B (Patent Literature 3), for example), a Si-added AlTiSiN coating (see JP 2840541 B (Patent Literature 4), for example), and an AlCrSiN coating (see JP 3640310 B (Patent Literature 5), for example) in addition to the above. Furthermore, a TiCrAlYN coating having excellent sliding properties has been proposed as a coating for a cold die used at 600° C. or lower (see JP 5193153 B (Patent Literature 6), for example).

Meanwhile, for a purpose of simultaneously exhibiting characteristic functions of single layer films having different properties by stacking a plurality of the single layer films, stacking of the coatings has been proposed. JP 3836640 B (Patent Literature 7) discloses a stacked film of TiAlN and TiVN films for exhibiting wear resistance and welding resistance of a cutting tool and a lubricating effect. Also, it is disclosed that a stacked coating of a TiSiN film and a TiAlN film is effective for exhibiting high oxidation resistance and wear resistance (see JP 3248897 B (Patent Literature 8), for example). Furthermore, JP 5730535 B (Patent Literature 9) discloses a bilayer film in which a TiCrAlSiYN film having high oxidation resistance and high strength, and a TiCrAlN film having high toughness are stacked. JP 6347566 B (Patent Literature 10) discloses a coating in which an AlSiVCrN film as an upper layer and an AlCrN film as a lower layer are stacked for improving heat resistance in addition to wear resistance and sliding properties. JP 4745243 B (Patent Literature 11) discloses a CrAlTiY layer having a Cr proportion of more than 65% as a wear-resistant layer for a cutting tool.

SUMMARY

However, higher efficiency has been required in pressing processing using a die and cutting processing using a cutting tool, and a workpiece to be processed have become more and more difficult to be cut and processed. Required in cutting processing is cutting processing of a wider portion, and cutting processing under severer cutting conditions has been required. Required in die processing is higher performance for various purposes as much as possible, such as cold forging, hot forging, and hot stamping. Thus, the hard coating has been required to have higher performance. Specifically, a hard coating having further improved wear resistance, heat resistance, low frictional and high sliding properties, welding resistance, and adhesiveness has been desired, and in addition, these performances are required to be exhibited under various processing conditions and exhibited for various materials to be processed.

The present invention has been made in view of the above problems. An object of the present invention is to provide a hard coating having improved wear resistance, heat resistance, low frictional and high sliding properties, welding resistance, and adhesiveness.

An aspect of the hard coating includes: a lower layer having a composition composed of (Ti, Al)N or (Ti, Al, Mo)N; an intermediate layer formed on the lower layer; and an upper layer formed on the intermediate layer and having a composition composed of (Al, Ti, Cr, M)N, wherein the M represents one or more elements selected from Mo, V, and Y, the intermediate layer has a substantial composition composed of (Al, Ti, Cr, M)N and has the composition between the composition of the lower layer and the composition of the upper layer, each of an atomic proportion of Al, an atomic proportion of Ti, and an atomic proportion of M changes in a film thickness direction from a side of the lower layer toward a side of the upper layer, and an atomic proportion of Cr is larger as closer to the side of the upper layer in the film thickness direction.

An aspect of the hard coating can provide the hard coating having improved wear resistance, heat resistance, low frictional and high sliding characteristics, welding resistance, and adhesiveness.

DETAILED DESCRIPTION OF EMBODIMENTS

Figure 1:
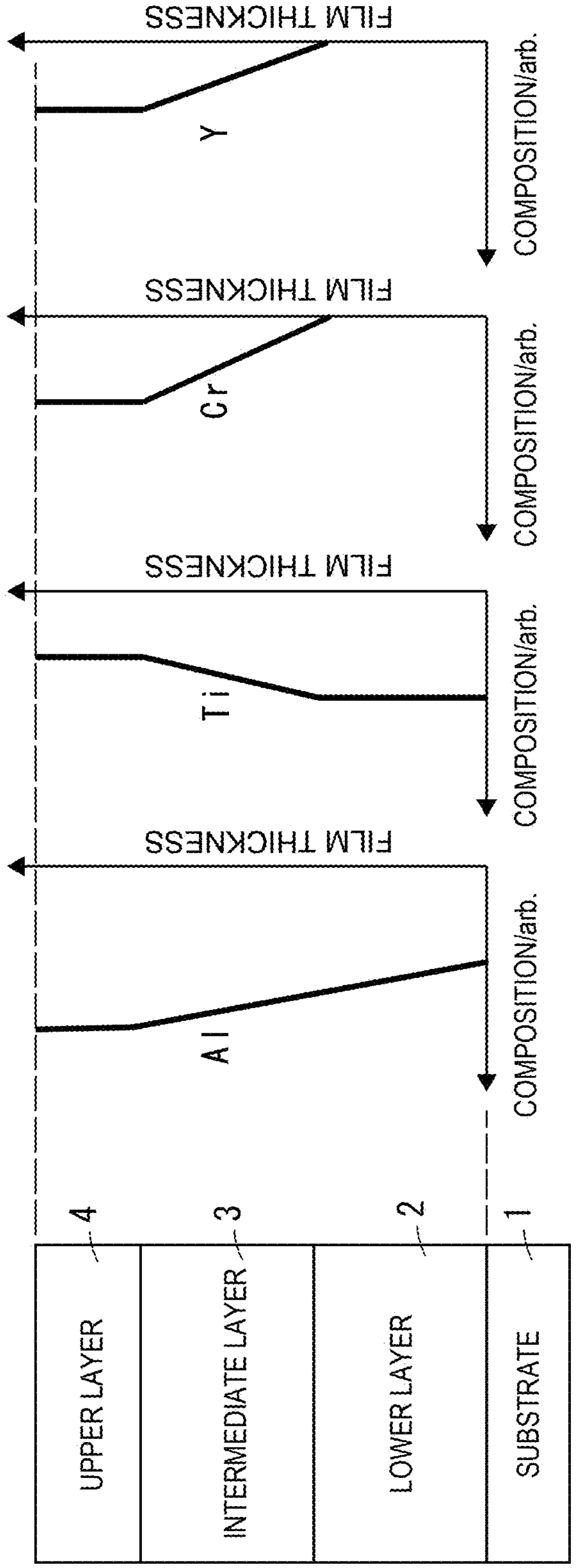
FIG. 1 is a view for describing an example of a first basic configuration of an embodiment of a hard coating.

The term "substantial composition of an intermediate layer" as used herein means an average composition in an entirety of the intermediate layer in a film thickness direction. The term "composition between a composition of a lower layer and a composition of an upper layer" means that an atomic proportion of each component is a value between the composition of the lower layer and the composition of the upper layer.

In an aspect of the hard coating, the intermediate layer may be a film in which films having the same composition as the upper layer and films having the same composition as the lower layer are alternately stacked.

Another aspect of the hard coating includes: a lower layer having a composition composed of (Ti, Al)N or (Ti, Al, Mo)N; an intermediate layer formed on the lower layer; and an upper layer formed on the intermediate layer and having a composition composed of (Al, Ti, Cr, M)N, wherein the M represents one or more elements selected from Mo, V, and Y, the intermediate layer is a film in which films having the same composition as the upper layer and films having the same composition as the lower layer are alternately stacked, and an atomic proportion of Al in the intermediate layer increases or decreases from a side of the lower layer toward a side of the upper layer in a film thickness direction.

In the above aspect, when the composition of the upper layer is represented by (Al1-y-z-aTiyCrzMa)N, "y", "z", and "a" each representing an atomic proportion may satisfy $0<y\leq0.45$, $0<z\leq0.5$, and $0<a\leq0.02$.

In the above aspect, when the composition of the lower layer is represented by (Til-xAlxMob)N, "x" and "b" each representing an atomic proportion may satisfy $0.4\leq x\leq0.70$ and $0\leq b\leq0.10$.

In the above aspect, the M represents Y, for example.

In the above aspect, an atomic proportion of M in Al, Ti, Cr, M, and N contained in an entirety of the hard coating may be smaller than 0.01.

Still another aspect of the hard coating is a hard coating formed on a substrate, the hard coating including: a lower layer having a composition composed of (Ti, Al)N or (Ti, Al, Mo)N; and an upper layer formed on the lower layer and having a composition composed of (Al, Ti, Cr, M)N, wherein the M represents one or more elements selected from Mo, V, and Y, and an atomic proportion of M in Al, Ti, Cr, M, and N contained in an entirety of the hard coating is smaller than 0.01.

In such an aspect, when the composition of the lower layer is represented by (Til-xAlxMob)N, "x" and "b" each representing an atomic proportion may satisfy $0.4\leq x\leq0.70$ and $0\leq 0.10$, and when the composition of the upper layer is represented by (Al1-y-z-aTiyCrzMa)N, "y", "z", and "a" each representing an atomic proportion may satisfy $0<y\leq0.45$, $0<z\leq0.5$, and $0<a\leq0.02$.

In the above aspect, (111)/{(111)+(200)+(220)} orientation by X-ray diffraction analysis may be 50% or more in an entirety of the coating.

A still another aspect of the hard coating is a hard coating including an upper layer constituting an outermost surface layer and having a composition composed of (Al, Ti, Cr, M)N, wherein the M represents one or more elements selected from Mo, V, and Y, and (111)/{(111)+(200)+(220)} orientation by X-ray diffraction analysis is 50% or more in an entirety of the coating.

In such an aspect, when the composition of the upper layer is represented by (Al1-y-z-aTiyCrzMa)N, "y", "z", and "a" each representing an atomic proportion may satisfy $0<y\leq0.45$, $0<z\leq0.5$, and $0<a\leq0.02$.

The hard coating may further comprise a lower layer having a composition composed of (Ti, Al)N or (Ti, Al, Mo)N between the upper layer and the substrate, and when the composition of the lower layer is represented by (Til-xAlxMob)N, "x" and "b" each representing an atomic proportion may satisfy $0.4\leq x\leq0.70$ and $0\leq b\leq0.10$.

The hard coating may further comprise an intermediate layer between the upper layer and the lower layer, the intermediate layer having a substantial composition composed of (Al, Ti, Cr, M)N or (Al, Ti, Cr, Mo, M)N and having the composition between the composition of the upper layer and the composition of the lower layer.

In the above aspect including the intermediate layer, an atomic proportion of Al in the intermediate layer may increase from a side of the lower layer toward a side of the upper layer in a film thickness direction. In addition, an increase rate of the atomic proportion of Al in a half of the intermediate layer on the side of the upper layer may be larger than that in a half on the side of the lower layer.

The atomic proportion of Al in the intermediate layer may decrease from the side of the lower layer toward the side of the upper layer in the film thickness direction, or the atomic proportion of Al may be uniform in the film thickness direction. When the atomic proportion of Al in the intermediate layer decreases from the side of the lower layer toward the side of the upper layer in the film thickness direction, a decrease rate of the atomic proportion of Al in a half of the intermediate layer on the side of the upper layer may be larger than that in a half on the side of the lower layer.

The atomic proportion of Ti in the intermediate layer may decrease from the side of the lower layer toward the side of the upper layer in the film thickness direction. A decrease rate of the atomic proportion of Ti in a half of the intermediate layer on the side of the upper layer may be larger than that in a half on the side of the lower layer.

An increase rate of the atomic proportion of Cr in a half of the intermediate layer on the side of the upper layer may be larger than that in a half on the side of the lower layer.

The lower layer may have a composition composed of (Ti, Al)N, and when the composition is represented by (Til-xAlx)N, "x" representing an atomic proportion may satisfy $0.4\leq x\leq0.70$. The atomic proportion of M in the intermediate layer may increase from the side of the lower layer toward the side of the upper layer in the film thickness direction. In this case, an increase rate of the atomic proportion of M in a half of the intermediate layer on the side of the upper layer may be larger than that in a half on the side of the lower layer.

The lower layer may have a composition composed of (Ti, Al, Mo)N, and when the composition is represented by (Til-xAlxMob)N, "x" and "b" each representing an atomic proportion may satisfy $0.4 \leq x \leq 0.70$ and $0 < b \leq 0.05$. The M may represent one or more elements selected from V and Y. The atomic proportion of Mo in the intermediate layer may decrease from the side of the lower layer toward the side of the upper layer in the film thickness direction, and the atomic proportion of M may increase from the side of the lower layer toward the side of the upper layer in the film thickness direction. In this case, each of a decrease rate of the atomic proportion of Mo and an increase rate of the atomic proportion of M in a half of the intermediate layer on the side of the upper layer may be larger than that in a half on the side of the lower layer.

In the above aspect, the compositions of the intermediate layer and the upper layer are (Al, Ti, Cr, Mo)N, (Al, Ti, Cr, V)N, (Al, Ti, Cr, Y)N, (Al, Ti, Cr, Mo, V)N, (Al, Ti, Cr, Mo, Y)N, (Al, Ti, Cr, V, Y)N, or (Al, Ti, Cr, Mo, V, Y)N.

A still another aspect of the hard coating includes: a lower layer having a composition composed of (Ti, Al)N or (Ti, Al, Mo)N; an intermediate layer formed on the lower layer; and an upper layer formed on the intermediate layer and having a composition composed of (Al, Ml, M)N, wherein the Ml represents one element selected from Ti and Cr, the M represents one or more elements selected from Mo, V, and Y, the hard coating including the intermediate layer between the upper layer and the lower layer, the intermediate layer having a substantial composition composed of (Al, Ti, Ml, M)N and having the intermediate composition between the composition of the upper layer and the composition of the lower layer, and an atomic proportion of Al in the intermediate layer increases or decreases in a film thickness direction from a side of the lower layer toward a side of the upper layer.

In this aspect, the composition of the upper layer is (Al, Ti, Mo)N, (Al, Ti, V)N, (Al, Ti, Y)N, (Al, Ti, Mo, V)N, (Al, Ti, Mo, Y)N, (Al, Ti, V, Y)N, (Al, Ti, Mo, V, Y)N, (Al, Cr, Mo)N, (Al, Cr, V)N, (Al, Cr, Y)N, (Al, Cr, Mo, V)N, (Al, Cr, Mo, Y)N, (Al, Cr, V, Y)N, or (Al, Cr, Mo, V, Y)N, and preferably (Al, Ti, Mo)N, (Al, Ti, V)N, (Al, Cr, Mo)N, or (Al, Cr, V)N.

In the above aspect, the intermediate layer may be a film in which films having the same composition as the upper layer and films having the same composition as the lower layer are alternately stacked.

In the above aspect, when the composition of the upper layer is represented by (Al1-a-cM1cMa)N, "a" and "c" each representing an atomic proportion may satisfy $0 \leq c \leq 0.5$ and $0 < a \leq 0.02$, and any of "y" and "z" represents 0.

In the above aspect, an increase rate of the atomic proportion of Al in a half of the intermediate layer on the side of the upper layer may be larger than that in a half on the side of the lower layer.

In the above aspect, an atomic proportion of M in Al, Ti, Ml, M, and N contained in an entirety of the hard coating is preferably smaller than 0.01.

In the above aspect, the atomic proportion of Al in the intermediate layer may increase from the side of the lower layer toward the side of the upper layer in the film thickness direction. In this case, examples in which an increase rate of the atomic proportion of Al in a half of the intermediate layer on the side of the upper layer is larger than that in a half on the side of the lower layer can be mentioned.

In the above aspect, an atomic proportion of at least one of the Ml and the M in the intermediate layer may increase or decrease in the film thickness direction from the side of the lower layer toward the side of the upper layer. In this case, the atomic proportion of at least one of the Ml and the M in the intermediate layer may change in the film thickness direction from the side of the lower layer toward the side of the upper layer so that the proportion approaches an atomic proportion of Cr, Ti, Mo, V, or Y in the upper layer. Furthermore, a changing rate of the atomic proportion of at least one of the Ml and the M in a half of the intermediate layer on the side of the upper layer may be larger than that in a half on the side of the lower layer.

Figure 2:
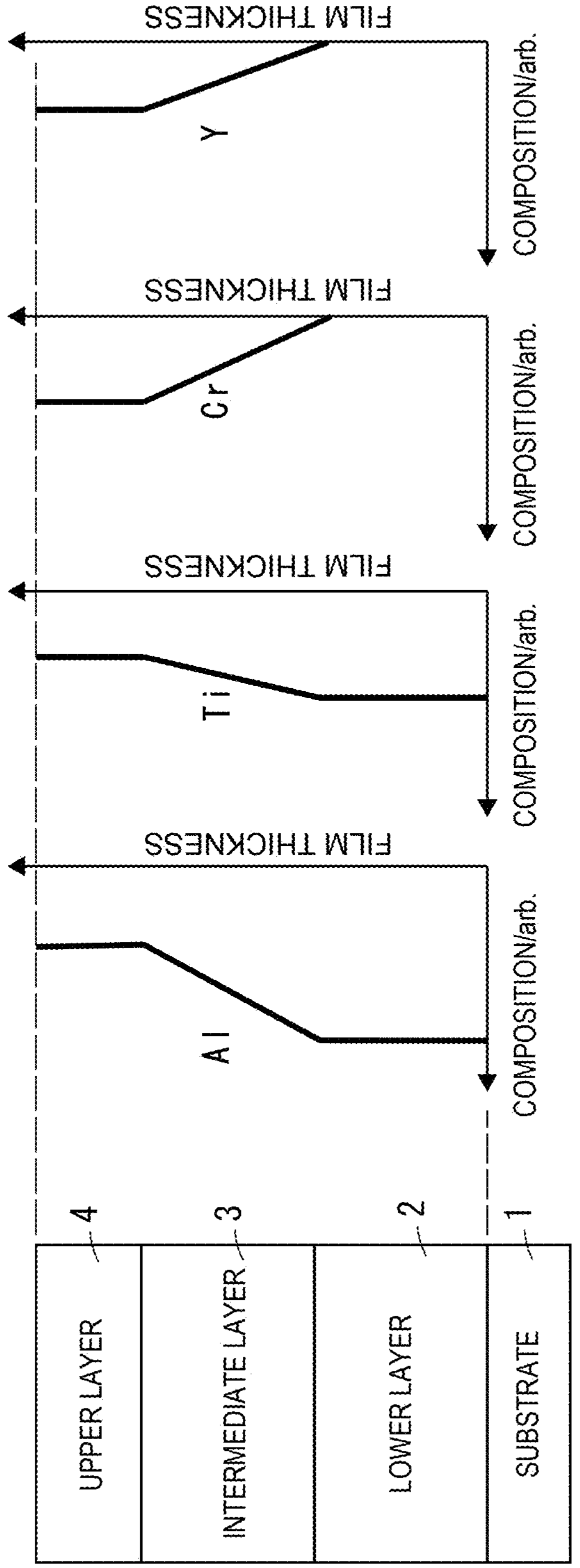
FIG. 2 is a view for describing another example of the first basic configuration of an embodiment of a hard coating.
Figure 3:
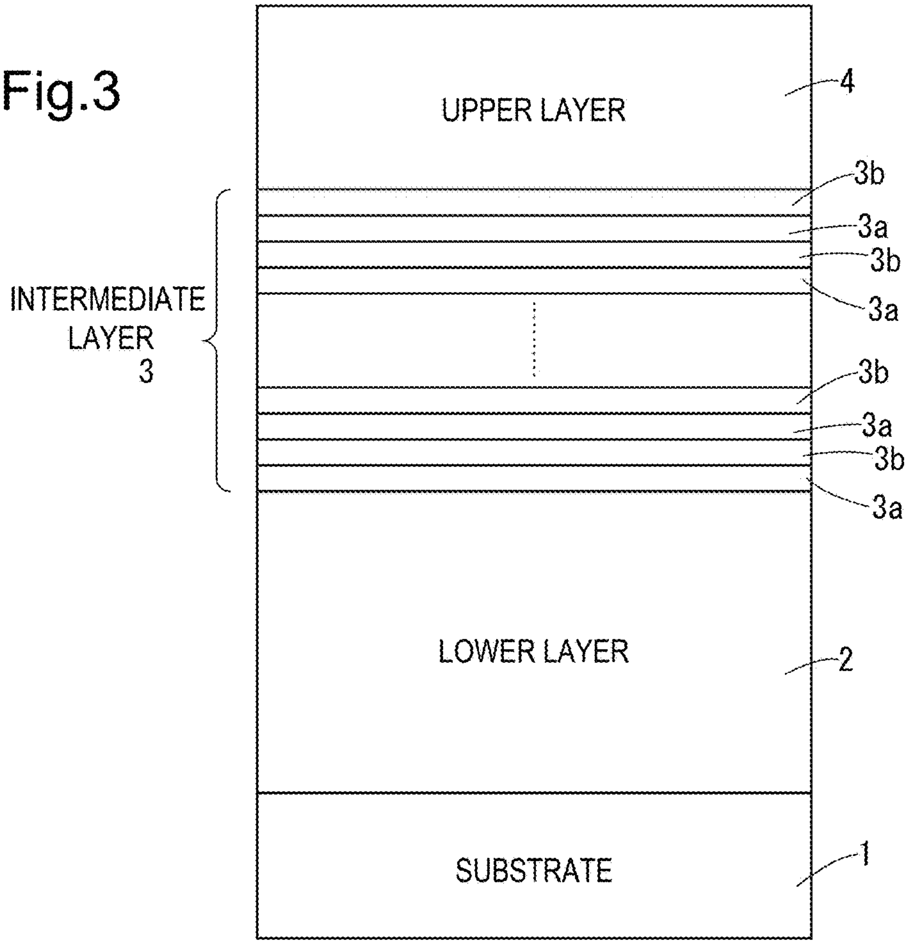
FIG. 3 is a view for describing a second basic configuration of an embodiment of a hard coating.
Figure 4:
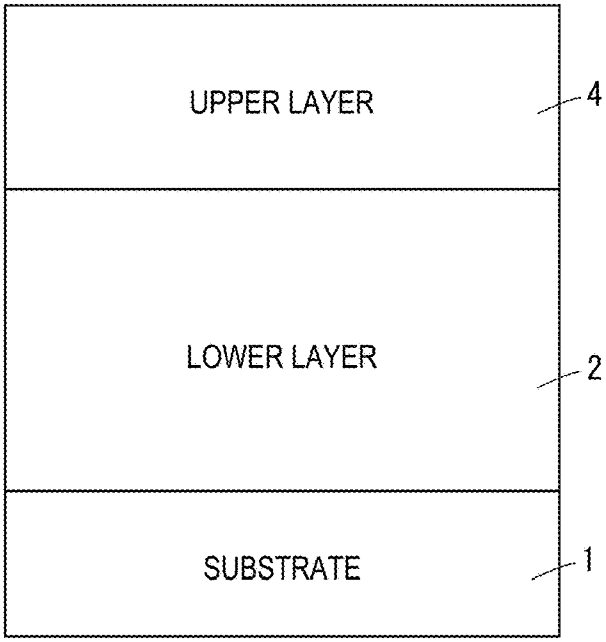
FIG. 4 is a view for describing a third basic configuration of an embodiment of a hard coating.

Hereinafter, the aspects of the hard coating will be described with reference to the drawings. First, first to third basic configurations of the embodiments will be described. Each of FIG. 1 and FIG. 2 is a view for describing the first basic configuration. The left view is a schematic cross-sectional view, and the right views are graphs indicating an atomic proportion of each composition in the film thickness direction. In the graphs of FIG. 1 and FIG. 2, the vertical axis represents a film thickness, and the horizontal axis represents an atomic proportion (given unit). FIG. 3 is a schematic cross-sectional view for describing the second basic configuration. FIG. 4 is a schematic cross-sectional view for describing the third basic configuration. As for a ratio between film thicknesses of each layer in the schematic cross-sectional views in FIG. 1 to FIG. 4, an example is schematically illustrated, and the ratio between the film thicknesses of each layer to constitute the first basic configuration is not limited to the ratios illustrated in FIG. 1 to FIG. 4.

Summary of First Basic Configuration

As illustrated in FIG. 1 and FIG. 2, the first basic configuration of the hard coating includes: a lower layer 2 formed on a substrate 1; an intermediate layer 3 formed on the lower layer 2; and an upper layer 4 formed on the intermediate layer 3. The lower layer 2 has a composition composed of (Ti, Al)N. The upper layer 4 has a composition composed of (Al, Ti, Cr, Y)N. The intermediate layer 3 has a substantial composition composed of (Al, Ti, Cr, Y)N and has the composition between the composition of the lower layer 2 and the composition of the upper layer 4.

In the intermediate layer 3, each of an atomic proportion of Al and an atomic proportion of Ti in the film thickness direction changes from a side of the lower layer 2 toward a side of the upper layer 4. Specifically, the atomic proportion of Al and the atomic proportion of Ti in the film thickness of the intermediate layer 3 change from the side of the lower layer 2 toward the side of the upper layer 4 so as to approach an atomic proportion of Al and an atomic proportion of Ti in the upper layer 4. In the intermediate layer 3, each of an atomic proportion of Cr and an atomic proportion of Y is larger as closer to the side of the upper layer 4 in the film thickness direction.

When the hard coating of the first basic configuration is applied for a die for pressing processing or a cutting tool for cutting processing, for example, the upper layer 4 is contacted with a workpiece during the processing to be solely subjected to sliding and pressure at high temperature, and subjected to wearing and high-temperature oxidation. Here, the upper layer 4 composed of (Al, Ti, Cr, Y)N has extremely excellent wear resistance and oxidation resistance, and thereby an entirety of the hard coating has extremely high durability. In a case where the upper layer 4 is subjected to sliding with the workpiece during the processing and oxidized at high temperature, even when Al and/or Ti in the upper layer 4 is eluted from the upper layer 4 due to a chemical reaction such as welding, Al and/or Ti is supplemented from the intermediate layer 3 or the lower layer 2, which is an underlayer of the upper layer 4. Therefore, in the hard coating of the first basic configuration, even when the upper layer 4 is subjected to sliding and oxidation, change in the composition of the upper layer 4 is inhibited to retain the durability. Thus, the hard coating of the first basic configuration lengthens the lifetime of the hard coating, providing the hard coating having a long lifetime and excellent wear resistance, heat resistance, low frictional and high sliding properties, welding resistance, adhesiveness, etc. Thus, the hard coating of the first basic configuration can remarkably improve processing performance in press die processing, cutting processing, etc.

Furthermore, in the hard coating of the first basic configuration, each of atomic proportions of Al, Ti, Cr, and Y in the intermediate layer 3 changes in the film thickness direction from the side of the lower layer 2 toward the side of the upper layer 4 as noted above. This change stabilizes adhesion force on interfaces between the substrate 1, the lower layer 2, and the upper layer 4. Also, the change in the composition more effectively exhibits toughness, specifically required in the lower layer 2, and wear resistance and heat resistance, specifically required in the upper layer 4, and thereby excellent wear resistance, heat resistance, and durability can be exhibited.

The intermediate layer 3 in which the composition changes in the film thickness direction can be formed by, for example: alternately stacking films formed with a plurality of targets used in an arc-ion plating method, a reactive sputtering method, etc.; and setting film thicknesses of the film formed with at least one of the targets to be different on the lower layer side and the upper layer side.

Modified Example of First Basic Configuration

In the intermediate layer 3 of the first basic configuration, the atomic proportion of Al in the film thickness direction may be larger as closer to the side of the upper layer 4, and the atomic proportion of Ti may be smaller as closer to the side of the upper layer 4, for example, as illustrated in FIG. 1. In this configuration in which the Al atomic proportion in the upper layer 4 is larger than the Al atomic proportion in the lower layer 2 and in which the Ti atomic proportion in the upper layer 4 is smaller than the Ti atomic proportion in the lower layer 2, the atomic proportion of Al and the atomic proportion of Ti in the film thickness direction of the intermediate layer 3 can be changed from the side of the lower layer 2 toward the side of the upper layer 4 so as to approach the atomic proportion of Al and the atomic proportion of Ti in the upper layer 4.

An increase rate of the atomic proportion of Al in a half of the intermediate layer 3 on the side of the upper layer 4 may be larger than that in a half on the side of the lower layer 2. A decrease rate of the atomic proportion of Ti in a half of the intermediate layer 3 on the side of the upper layer 4 may be larger than that in a half on the side of the lower layer 2. In these configurations, a content rate of the element exhibiting heat resistance and wear resistance is increased on the side of the upper layer 4, which specifically requires these characteristics, to enable to exhibit more excellent heat resistance and wear resistance, and setting the composition of the intermediate layer 3 near the interface on the side of the upper layer 4 to be close to the composition of the upper layer 4 can yield excellent interlayer adhesion force between the intermediate layer 3 and the upper layer 4. When the required element is thickened, changing the element amount continuously, not intermittently, can keep and stabilize toughness of the coating, and enables the hard coating to exhibit excellent characteristics without breakage even under a use environment with large impact to easily cause damage, chipping, etc. of the hard coating.

In the intermediate layer 3, an atomic proportion of Al in the film thickness direction may decrease from the side of the lower layer 2 toward the side of the upper layer 4 (see FIG. 2), or the atomic proportion of Al in the film thickness direction may be uniform. In the intermediate layer 3, an atomic proportion of Ti in the film thickness direction may increase from the side of the lower layer 2 toward the side of the upper layer 4, or the atomic proportion of Ti in the film thickness direction may be uniform.

In the first basic configuration, an increase rate of the atomic proportion of Cr in a half of the intermediate layer 3 on the side of the upper layer 4 may be larger than that in a half on the side of the lower layer 2. An increase rate of the atomic proportion of Y in a half of the intermediate layer 3 on the side of the upper layer 4 may be larger than that in a half on the side of the lower layer 2. These configurations allow an effect by Y of keeping mechanical characteristics at high temperature to exhibit more as closer to the surface of the hard coating, and thereby the hard coating can exhibit excellent hardness and Young's modulus even at high temperature, and can exhibit excellent wear resistance even under a severer use environment.

Summary of Second Basic Configuration

As illustrated in FIG. 3, the second basic configuration of the hard coating includes: a lower layer 2 formed on a substrate 1; an intermediate layer 3 formed on the lower layer 2; and an upper layer 4 formed on the intermediate layer 3. The lower layer 2 has a composition composed of (Til-xAlx)N, and "x" representing an atomic proportion satisfies $0.4 \leq x \leq 0.70$. The upper layer 4 has a composition composed of (All-y-z-aTiyCrzYa)N, and "y", "z", and "a" each representing an atomic proportion satisfy $0<y\leq 0.45$, $0<z\leq 0.5$, and $0<a\leq 0.02$. The intermediate layer 3 is a film in which first intermediate films **3*a* having the same composition as the upper layer 4 and second intermediate films 3*b*** having the same composition as the upper layer 4 are alternately stacked.

The hard coating of the second basic configuration includes the upper layer 4 having a composition composed of (Al, Ti, Cr, Y)N. Thus, the hard coating having a long lifetime and excellent wear resistance, heat resistance, low frictional and high sliding properties, welding resistance, adhesiveness, etc. can be obtained similarly to the first basic configuration.

The upper layer 4 satisfies $0<y\leq 0.45$, $0<z\leq 0.5$, and $0<a\leq 0.02$ when the composition is represented by (All-y-z-aTiyCrzYa)N. Thus, the hard coating can exhibit excellent hardness and Young's modulus at not only room temperature but also high temperature, and can exhibit excellent wear resistance even under a severer use environment.

Here, $0.05\leq y\leq 0.3$ is preferable, $0.15\leq z\leq 0.5$ is preferable, and $0.005\leq a\leq 0.01$ is preferable.

The lower layer 2 satisfies $0.4\leq x\leq 0.70$ when the composition is represented by (Til-xAlx)N, and thereby the hard coating can exhibit excellent wear resistance, heat resistance, and damage resistance.

Here, $0.5\leq x\leq 0.67$ is preferable.

Furthermore, in the hard coating of the second basic configuration, the intermediate layer 3 is the film in which the first intermediate films **3*a* having the same composition as the upper layer 4 and second intermediate films 3*b*** having the same composition as the upper layer 4 are alternately stacked, and thereby the hard coating relaxes residual stress between the lower layer 2 and the upper layer 4 to improve the adhesion force, which can keep and stabilize toughness of the hard coating. Thus, the hard coating can exhibit excellent characteristics without breakage even under a use environment with large impact to easily cause damage, chipping, etc. of the hard coating.

In the hard coating of the second basic configuration, the intermediate layer 3 has an average composition of (Al, Ti, Cr, Y)N as an entirety of the film. The intermediate layer 3 of the second basic configuration constitutes an example of the intermediate layer 3 of the first basic configuration. Note that the intermediate layer 3 of the first basic configuration is not limited thereto, and the intermediate layer 3 may have a film (layer) having a different composition from the lower layer 2 and the upper layer 4, for example.

Modified Example of Second Basic Configuration

In the intermediate layer 3 of the second basic configuration, each of the atomic proportions of Al, Ti, Cr, and Y may change in the film thickness direction, similarly to the intermediate layer 3 of the first basic configuration. Note that, when the Al atomic proportion in the lower layer 2 and the Al atomic proportion in the upper layer 4 are same, the Al atomic proportion in the intermediate layer 3 is uniform and does not change in the film thickness direction.

Summary of Third Basis Configuration

As illustrated in FIG. 4, the third basis configuration of the hard coating is a hard coating formed on a substrate 1 and includes: a lower layer 2 having a composition composed of (Ti, Al)N; and an upper layer 4 formed on the lower layer 2 and having a composition composed of (Al, Ti, Cr, Y)N, wherein an atomic proportion of Y in Al, Ti, Cr, Y, and N contained in an entirety of the hard coating is smaller than 0.01.

The hard coating of the third basic configuration includes the upper layer 4 having a composition composed of (Al, Ti, Cr, Y)N. Thus, the hard coating having a long lifetime and excellent wear resistance, heat resistance, low frictional and high sliding properties, welding resistance, adhesiveness, etc. can be obtained, similarly to the first basic configuration.

Furthermore, the atomic proportion of Y in Al, Ti, Cr, Y, and N contained in the entirety of the hard coating is smaller than 0.01, and thereby the hard coating can exhibit excellent hardness and Young's modulus at not only room temperature but also high temperature, and can exhibit excellent wear resistance even under a severer use environment. In addition, Y hardly diffuses and permeates near an interface of the lower layer 2 with the substate 1, and the hard coating can keep the damage resistance of the lower layer 2. Thus, the hard coating can exhibit excellent characteristics without peeling from the substrate even under a use environment with applied higher load and large impact to easily cause damage, chipping, etc. of the hard coating.

Modified Example of Third Basic Configuration

The hard coating may further comprise an intermediate layer 3 between the lower layer 2 and the upper layer 4, the intermediate layer 3 having a substantial composition composed of (Al, Ti, Cr, Y)N and having the composition between the composition of the upper layer 4 and the composition of the lower layer 2. Such an intermediate layer 3 may be composed of the intermediate layer 3 of the first and second basic configurations and the modified examples thereof, for example.

Summary of Fourth Basic Configuration

A hard coating of a fourth basic configuration is a hard coating including an upper layer constituting an outermost surface layer and having a composition composed of (Al, Ti, Cr, Y)N, wherein (111)/{(111)+(200)+(220)} orientation by X-ray diffraction analysis is 50% or more in an entirety of the coating.

The hard coating of the fourth basic configuration includes the upper layer having a composition composed of (Al, Ti, Cr, Y)N, and thereby the hard coating having a long lifetime and excellent wear resistance, heat resistance, low frictional and high sliding properties, welding resistance, adhesiveness, etc. can be obtained similarly to the first basic configuration.

The upper layer constituting the outermost surface layer has the (111)/{(111)+(200)+(220)} orientation by X-ray diffraction analysis of 50% or more in an entirety of the coating, and thereby the coating exhibits a pillar structure, and has excellent damage resistance also against shearing stress in the film thickness direction. Thus, the hard coating can exhibit excellent characteristics without breakage even under a use environment with large impact to easily cause damage, chipping, etc. of the hard coating.

Note that the aforementioned basic configurations and each configuration described in the modified examples (notes, etc.) may be combined, and addition, omission, substitution, and other modifications of the configurations may be made. For example, the fourth basic configuration may be combined with the first to third basic configurations.

Summary of Fifth Basic Configuration

In a fifth basic configuration of the hard coating, the compositions of the intermediate layer 3 and the upper layer 4 of the above first basic configuration, (Al, Ti, Cr, Y)N, are changed to (Al, Ti, Cr, Mo)N, (Al, Ti, Cr, V)N, (Al, Ti, Cr, Mo, V)N, (Al, Ti, Cr, Mo, Y)N, (Al, Ti, Cr, V, Y)N, or (Al, Ti, Cr, Mo, V, Y)N. That is, the upper layer 4 has a composition composed of (Al, Ti, Cr, Mo)N, (Al, Ti, Cr, V)N, (Al, Ti, Cr, Mo, V)N, (Al, Ti, Cr, Mo, Y)N, (Al, Ti, Cr, V, Y)N, or (Al, Ti, Cr, Mo, V, Y)N. The intermediate layer 3 has a substantial composition composed of (Al, Ti, Cr, Mo)N, (Al, Ti, Cr, V)N, (Al, Ti, Cr, Mo, V)N, (Al, Ti, Cr, Mo, Y)N, (Al, Ti, Cr, V, Y)N, or (Al, Ti, Cr, Mo, V, Y)N, and had the composition between the composition of the lower layer 2 and the composition of the upper layer 4.

In the intermediate layer 3, each of an atomic proportion of Al, an atomic proportion of Ti, and an atomic proportion Cr in the film thickness direction changes from a side of the lower layer 2 toward a side of the upper layer 4, similarly to the above first basic configuration. In the intermediate layer 3, atomic proportions of Mo, V, and Y are larger as closer to the side of the upper layer 4.

In the hard coating of the fifth basic configuration, the upper layer 4 composed of (Al, Ti, Cr, Mo)N, (Al, Ti, Cr, V)N, (Al, Ti, Cr, Mo, V)N, (Al, Ti, Cr, Mo, Y)N, (Al, Ti, Cr, V, Y)N, or (Al, Ti, Cr, Mo, V, Y)N has extremely excellent wear resistance and oxidation resistance, and extremely high durability in an entirety of the hard coating, similarly to the upper layer 4 of the first basic configuration composed of (Al, Ti, Cr, Y)N. Therefore, the hard coating of the fifth basic configuration yields the same action and effect as of the hard coating in the first basic configuration.

Modified Example of Fifth Basic Configuration

In the fifth basic configuration, the atomic proportion of Al and the atomic proportion of Ti in the film thickness direction in the intermediate layer 3 may change, similarly to the modified example of the first basic configuration. Such a modified example of the fifth basic configuration yields the action and effect same as of the modified example of the first basic configuration. Note that, in the intermediate layer 3 in the modified example of the fifth basic configuration, the atomic proportion of Al in the film thickness direction may be uniform, and the atomic proportion of Ti in the film thickness direction may be uniform.

In the fifth basic configuration, an increase rate of the atomic proportion of Cr in a half of the intermediate layer 3 on the side of the upper layer 4 may be larger than that in a half on the side of the lower layer 2. In addition, increase rates of the atomic proportions of Mo, V, and Y in the half of the intermediate layer 3 on the side of the upper layer 4 may be larger than those in a half on the side of the lower layer 2. These configurations allow the effect by Mo, V, and Y of keeping mechanical characteristics at high temperature to exhibit more as closer to the surface of the hard coating, and thereby the hard coating can exhibit excellent hardness and Young's modulus even at high temperature, and can exhibit excellent wear resistance even under a severer use environment.

Summary of Sixth Basic Configuration

A sixth basic configuration of the hard coating includes: a lower layer 2 formed on a substrate 1; an intermediate layer 3; and an upper layer 4, similarly to the above second basic configuration. The lower layer 2 has a composition composed of (Til-xAlx)N, and "x" representing an atomic proportion satisfies $0.4 \le x \le 0.70$. The upper layer 4 has a composition composed of (All-y-z-aTiyCrzMa)N, and "y", "z", and "a" each representing an atomic proportion satisfy $0<y \le 0.45$, $0<z \le 0.5$, and $0<a \le 0.02$. Here, M represents one or more elements selected from Mo, V, and Y (note that, when M represents Y, the configuration is same as the above second basic configuration). The intermediate layer 3 is a film in which first intermediate films 3*a* having the same composition as the upper layer 4 and second intermediate films 3*b* having the same composition as the upper layer 4 are alternately stacked.

The hard coating of the sixth basic configuration includes the upper layer 4 having a composition composed of (Al, Ti, Cr, M)N, wherein M represents one or more elements selected from Mo, V, and Y. Thus, the hard coating having a long lifetime and excellent wear resistance, heat resistance, low frictional and high sliding properties, welding resistance, adhesiveness, etc. can be obtained similarly to the first basic configuration and the fifth basic configuration.

The upper layer 4 satisfies $0<y \le 0.45$, $0<z \le 0.5$, and $0<a \le 0.02$ when the composition is represented by (All-y-z-aTiyCrzMa)N, wherein M represents one or more elements selected from Mo, V, and Y. Thus, the hard coating can exhibit excellent hardness and Young's modulus at not only room temperature but also high temperature, and can exhibit excellent wear resistance even under a severer use environment. Here, $0.05 \le y \le 0.3$ is preferable, $0.15 \le z \le 0.5$ is preferable, and $0.005 \le a \le 0.01$ is preferable.

In the hard coating of the sixth basic configuration, the intermediate layer 3 has an average composition of (Al, Ti, Cr, Mo)N, (Al, Ti, Cr, V)N, (Al, Ti, Cr, Y)N, (Al, Ti, Cr, Mo, V)N, (Al, Ti, Cr, Mo, Y)N, (Al, Ti, Cr, V, Y)N, or (Al, Ti, Cr, Mo, V, Y)N as an entirety of the film. The intermediate layer 3 of the sixth basic configuration constitutes an example of the intermediate layer 3 of the fifth basic configuration. Note that the intermediate layer 3 of the fifth basic configuration is not limited thereto, and may have a film (layer) having a different composition from the lower layer 2 and the upper layer 4, for example.

Summary of Seventh Basic Configuration

A seventh basic configuration of the hard coating is a hard coating formed on a substrate 1 and includes: a lower layer 2 having a composition composed of (Ti, Al)N; and an upper layer 4 formed on the lower layer 2 and having a composition composed of (Al, Ti, Cr, M)N, wherein M represents one or more elements selected from Mo, V, and Y, and an atomic proportion of M in Al, Ti, Cr, M, and N contained in an entirety of the hard coating is smaller than 0.01.

The hard coating of the seventh basic configuration includes the upper layer 4 having a composition composed of (Al, Ti, Cr, M)N, wherein M represents one or more elements selected from Mo, V, and Y. Thus, the hard coating having a long lifetime and excellent wear resistance, heat resistance, low frictional and high sliding properties, welding resistance, adhesiveness, etc. can be obtained similarly to the first basic configuration and the fifth basic configuration.

Furthermore, the atomic proportion of M (which represents one or more elements selected from Mo, V, and Y) in Al, Ti, Cr, M, and N contained in the entirety of the hard coating is smaller than 0.01. Thus, the hard coating can exhibit excellent hardness and Young's modulus at not only room temperature but also high temperature, and can exhibit excellent wear resistance even under a severer use environment. In addition, Mo, V, and Y hardly diffuse and permeate near an interface of the lower layer 2 with the substate 1, and the hard coating can keep the damage resistance of the lower layer 2. Thus, the hard coating can exhibit excellent characteristics without peeling from the substrate even under a use environment with applied higher load and large impact to easily cause damage, chipping, etc. of the hard coating.

Summary of Eighth Basic Configuration

A hard coating of an eighth basic configuration is a hard coating including an upper layer constituting an outermost surface layer and having a composition composed of (Al, Ti, Cr, M)N, wherein (111)/{(111)+(200)+(220)} orientation by X-ray diffraction analysis is 50% or more in an entirety of the coating. Here, M represents one or more elements selected from Mo, V, and Y.

The hard coating of the eighth basic configuration includes the upper layer having a composition composed of (Al, Ti, Cr, M)N, wherein M represents one or more elements selected from Mo, V, and Y. Thus, the hard coating having a long lifetime and excellent wear resistance, heat resistance, low frictional and high sliding properties, welding resistance, adhesiveness, etc. can be obtained similarly to the first basic configuration and the fifth basic configuration.

The upper layer constituting the outermost surface layer has the (111)/{(111)+(200)+(220)} orientation by X-ray diffraction analysis of 50% or more in an entirety of the coating, and thereby the coating exhibits a pillar structure, and has excellent damage resistance also against shearing stress in the film thickness direction. Thus, the hard coating can exhibit excellent characteristics without breakage even under a use environment with large impact to easily cause damage, chipping, etc. of the hard coating.

Note that the aforementioned basic configurations and each configuration described in the modified examples (notes, etc.) may be combined, and addition, omission, substitution, and other modifications of the configurations can be made. For example, the eighth basic configuration may be combined with the fifth to seventh basic configurations.

Summary of Ninth Basic Configuration

A hard coating of a ninth basic configuration includes: a lower layer 2 having a composition composed of (Ti, Al)N or (Ti, Al, Mo)N; an intermediate layer 3 formed on the lower layer 2; and an upper layer 4 formed on the intermediate layer 3 and having a composition composed of (Al, Ml, M)N. Ml represents one element selected from Ti and Cr. M represents one or more elements selected from Mo, V, and Y. Between the upper layer 4 and the lower layer 2, the hard coating includes the intermediate layer 3 having a substantial composition composed of (Al, Ti, Ml, M)N and having the intermediate composition between the composition of the upper layer 4 and the composition of the lower layer 2. An atomic proportion of Al in the intermediate layer 3 increases or decreases in a film thickness direction from a side of the lower layer 2 toward a side of the upper layer 4.

The composition of the upper layer 4 in the hard coating of the ninth basic configuration is (Al, Ti, Mo)N, (Al, Ti, V)N, (Al, Ti, Y)N, (Al, Ti, Mo, V)N, (Al, Ti, Mo, Y)N, (Al, Mo, V, Y)N, (Al, Ti, Mo, V, Y)N, (Al, Cr, Mo)N, (Al, Cr, V)N, (Al, Cr, Y)N, (Al, Cr, Mo, V)N, (Al, Cr, Mo, Y)N, (Al, Cr, V, Y)N, or (Al, Cr, Mo, V, Y)N, and preferably (Al, Ti, Mo)N, (Al, Ti, V)N, (Al, Cr, Mo)N, or (Al, Cr, V)N.

In the hard coating of the ninth basic configuration, the upper layer 4 composed of (Al, Ml, M)N (Ml represents one element selected from Ti and Cr, and M represents one or more elements selected from Mo, V, and Y) has extremely excellent wear resistance and oxidation resistance, and an entirety of the hard coating has extremely high durability. Even when the upper layer 4 in the hard coating of the ninth basic configuration is subjected to sliding and oxidation, change in the composition of the upper layer 4 is inhibited to retain the durability. Therefore, the hard coating of the ninth basic configuration lengthens the lifetime of the hard coating to provide the hard coating having a long lifetime and excellent wear resistance, heat resistance, low frictional and high sliding properties, welding resistance, adhesiveness, etc., similarly to the hard coatings of the above first to eighth basic configurations. The hard coating of the first basic configuration can remarkably improve processing performance in press die processing, cutting processing, etc.

Note that the aforementioned basic configurations and each configuration described in the modified examples (notes, etc.) may be combined, and addition, omission, substitution, and other modifications of the configurations can be made. For example, the intermediate layer 3 and the upper layer 4 of the ninth basic configuration may be substituted with the first to eighth basic configurations, or these configurations may be combined.

For example, the atomic proportion of Al, the atomic proportion Ml (Ti or Cr), and the atomic proportion of M (one or more elements selected from Mo, V, and Y) in the film thickness direction of the intermediate layer 3 may be changed from the side of the lower layer 2 toward the side of the upper layer 4 so as to approach the atomic proportion of Al, the atomic proportion of Ml (Ti or Cr), and the atomic proportion of M (one or more elements selected from Mo, V, and Y) in the upper layer 4. Changing rates of the atomic proportion of Al, the atomic proportion of the Ml, and the atomic proportion of the M in a half of the intermediate layer 3 on the side of the upper layer 4 may be larger than those in a half on the side of the lower layer 2. In these configurations, content rates of the elements exhibiting wear resistance and heat resistance on the side of the upper layer, which specifically requires these characteristics, are increased to enable to exhibit more excellent heat resistance and wear resistance, and setting the composition of the intermediate layer 3 near the interface on the side of the upper layer 4 to be close to the composition of the upper layer 4 can yield excellent interlayer adhesion force between the intermediate layer 3 and the upper layer 4. When the required elements are thickened, changing the element amount continuously, not intermittently, can keep and stabilize toughness of the coating, and enables the hard coating to exhibit excellent characteristics without breakage even under a use environment with large impact to easily cause damage, chipping, etc. of the hard coating.

Summary of Tenth Basic Configuration

Figure 5:
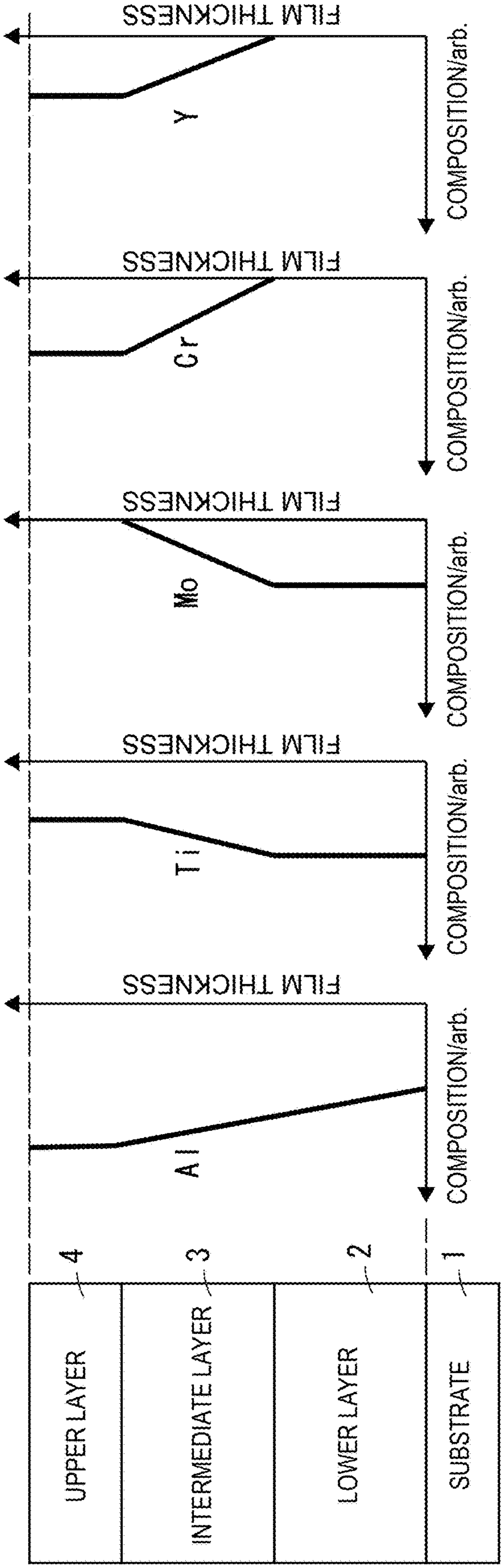
FIG. 5 is a view for describing an example of a tenth basic configuration of an embodiment of a hard coating.
Figure 6:
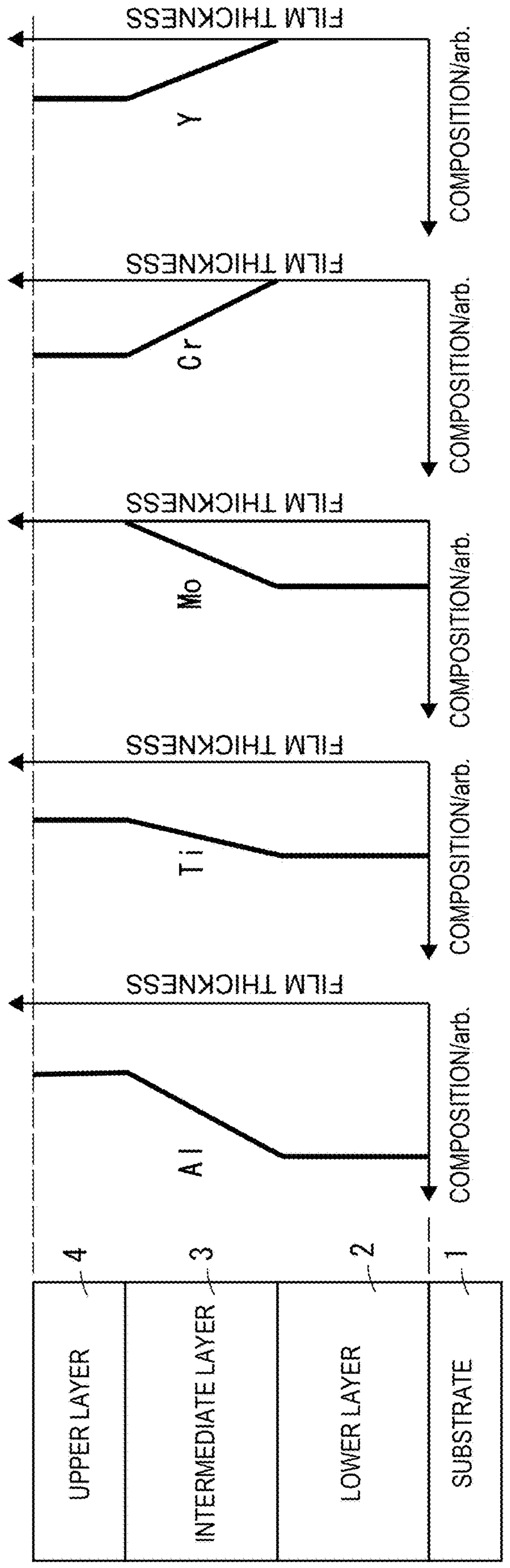
FIG. 6 is a view for describing another example of the tenth basic configuration of an embodiment of a hard coating.

As illustrated in FIG. 5 and FIG. 6, a tenth basic configuration of the hard coating includes: a lower layer 2 formed on a substrate 1; an intermediate layer 3 formed on the lower layer 2: and an upper layer 4 formed on the intermediate layer 3. The lower layer 2 has a composition composed of (Ti, Al, Mo)N. The upper layer 4 has a composition composed of (Al, Ti, Cr, Y)N. The intermediate layer 3 has a substantial composition composed of (Al, Ti, Cr, Y, Mo)N and has the composition between the composition of the lower layer 2 and the composition of the upper layer 4.

In the intermediate layer 3, each of an atomic proportion of Al, an atomic proportion of Ti, and an atomic proportion of Mo in the film thickness direction changes from the side of the lower layer 2 toward the side of the upper layer 4. Specifically, the atomic proportion of Al, the atomic proportion of Ti, and the atomic proportion of Mo in the film thickness direction of the intermediate layer 3 change from the side of the lower layer 2 toward the side of the upper layer 4 so as to approach the atomic proportion of Al, the atomic proportion of Ti, and the atomic proportion of Mo in the upper layer 4. Note that the atomic proportion of Mo in the upper layer 4 is 0. In the intermediate layer 3, each of the atomic proportion of Cr and the atomic proportion of Y in the film thickness direction is larger as closer to the side of the upper layer 4.

The hard coating of the tenth basic configuration includes the upper layer 4 having a composition composed of (Al, Ti, Cr, Y)N. Thus, the lifetime of the hard coating is lengthened to provide the hard coating having a long lifetime and excellent wear resistance, heat resistance, low frictional and high sliding properties, welding resistance, adhesiveness, etc., similarly to the first basic configuration. The hard coating of the tenth basic configuration can remarkably improve processing performance in press die processing, cutting processing, etc.

Furthermore, in the hard coating of the tenth basic configuration, each of the atomic proportions of Al, Ti, Cr, Y, and Mo in the intermediate layer 3 changes from the side of the lower layer 2 toward the side of the upper layer 4 in the film thickness direction as noted above. This change stabilizes adhesion force on interfaces between the substrate 1, the lower layer 2, and the upper layer 4. Also, the change in the composition more effectively exhibits toughness, specifically required in the lower layer 2, and wear resistance and heat resistance, specifically required in the upper layer 4, and thereby excellent wear resistance, heat resistance, and durability can be exhibited.

The intermediate layer 3 in which the composition changes in the film thickness direction can be formed by, for example: alternately stacking films formed with a plurality of targets used in an arc-ion plating method, a reactive sputtering method, etc.; and setting film thicknesses of the film formed with at least one of the targets to be different on the lower layer side and the upper layer side.

Modified Example of Tenth Basic Configuration

In the intermediate layer 3 of the first basic configuration, the atomic proportion of Al in the film thickness direction may be larger as closer to the side of the upper layer 4, and each of the atomic proportion of Ti and the atomic proportion of Mo may be smaller as closer to the side of the upper layer 4, for example, as illustrated in FIG. 5. In this configuration, in which the Al atomic proportion in the upper layer 4 is larger than the Al atomic proportion in the lower layer 2 and in which the Ti atomic proportion in the upper layer 4 is smaller than the Ti atomic proportion in the lower layer 2, each of the atomic proportion of Al, the atomic proportion of Ti, and the atomic proportion of Mo in the film thickness direction of the intermediate layer 3 can be changed from the side of the lower layer 2 toward the side of the upper layer 4 so as to approach an atomic proportion of Al and an atomic proportion of Ti in the upper layer 4.

An increase rate of the atomic proportion of Al in a half of the intermediate layer 3 on the side of the upper layer 4 may be larger than that in a half on the side of the lower layer 2. A decrease rate of the atomic proportion of Ti in a half of the intermediate layer 3 on the side of the upper layer 4 may be larger than that in a half on the side of the lower layer 2. A decrease rate of the atomic proportion of Mo in a half of the intermediate layer 3 on the side of the upper layer 4 may be larger than that in a half on the side of the lower layer 2. Each of increase rates of the atomic proportion of Cr and the atomic proportion of Y in a half of the intermediate layer 3 on the side of the upper layer 4 may be larger than that in a half on the side of the lower layer 2. In these configurations, a content rate of the element exhibiting wear resistance and heat resistance on the side of the upper layer, which specifically requires these characteristics, is increased to enable to exhibit more excellent heat resistance and wear resistance similarly to the first basic configuration. Furthermore, setting the composition of the intermediate layer 3 near the interface on the side of the upper layer 4 to be close to the composition of the upper layer 4 can yield excellent interlayer adhesion force between the intermediate layer 3 and the upper layer 4.

In the intermediate layer 3, the atomic proportion of Al in the film thickness direction may decrease from the side of the upper layer 2 toward the side of the upper layer 4 (see FIG. 6), or the atomic proportion of Al in the film thickness direction may be uniform. In the intermediate layer 3, the atomic proportion of Ti in the film thickness direction may increase from the side of the upper layer 2 toward the side of the upper layer 4, or the atomic proportion of Ti in the film thickness direction may be uniform.

In the tenth basic configuration, an increase rate of the atomic proportion of Cr in a half of the intermediate layer 3 on the side of the upper layer 4 may be larger than that in a half on the side of the lower layer 2. In addition, an increase rate of the atomic proportion of Y in the half of the intermediate layer 3 on the side of the upper layer 4 may be larger than that in a half on the side of the lower layer 2. These configurations allow the effect by Y of keeping mechanical characteristics at high temperature to exhibit more as closer to the surface of the hard coating similarly to the first basic configuration, and thereby the hard coating can exhibit excellent hardness and Young's modulus even at high temperature, and can exhibit excellent wear resistance even under a severer use environment.

Summary of Eleventh Basic Configuration

An eleventh basic configuration of the hard coating includes: a lower layer 2 formed on a substrate 1; an intermediate layer 3 formed on the lower layer 2; and an upper layer 4 formed on the intermediate layer 3, similarly to the schematic view of the second basic configuration described with reference to FIG. 3. The lower layer 2 has a composition composed of (Til-xAlxMob)N, and "x" and "b" each representing an atomic proportion satisfy $0.40<y\leq 0.70$ and $0<b\leq 0.10$. The upper layer 4 has a composition composed of (All-y-z-aTiyCrzYa)N, and "y", "z", and "a" each representing an atomic proportion satisfy $0<y\leq 0.45$, $0<z\leq 0.5$, and $0<a\leq 0.02$. The intermediate layer 3 is a film in which first intermediate films 3*a* having the same composition as the upper layer 4 and second intermediate films 3*b* having the same composition as the upper layer 4 are alternately stacked.

The hard coating of the eleventh basic configuration includes the upper layer 4 having a composition composed of (Al, Ti, Cr, Y)N. Thus, the hard coating having a long lifetime and excellent wear resistance, heat resistance, low frictional and high sliding properties, welding resistance, adhesiveness, etc. can be obtained, similarly to the first basic configuration.

The upper layer 4 satisfies $0<y\leq 0.45$, $0<z\leq 0.5$, and $0<a\leq 0.02$ when the composition is represented by (All-y-z-aTiyCrzYa)N. Thus, the hard coating can exhibit excellent hardness and Young's modulus at not only room temperature but also high temperature, and can exhibit excellent wear resistance even under a severer use environment similarly to the second basic configuration. Here, $0.05\leq y\leq 0.3$ is preferable, $0.15\leq z\leq 0.5$ is preferable, and $0.005\leq a\leq 0.01$ is preferable.

The lower layer 2 satisfies $0.4\leq x\leq 0.70$ and $0<b\leq 0.10$ when the composition is represented by (Til-xAlxMob)N. Thus, excellent wear resistance, heat resistance, and damage resistance can be exhibited. Here, $0.5\leq x\leq 0.67$ and $0.01\leq b\leq 0.04$ are preferable.

Furthermore, in the hard coating of the eleventh basic configuration, the intermediate layer 3 is the film in which the first intermediate films 3*a* having the same composition as the upper layer 4 and the second intermediate films 3*b* having the same composition as the upper layer 4 are alternately stacked, and thereby the hard coating relaxes residual stress between the lower layer 2 and the upper layer 4 to improve the adhesion force, which can keep and stabilize toughness of the hard coating. Thus, the hard coating can exhibit excellent characteristics without breakage even under a use environment with large impact to easily cause damage, chipping, etc. of the hard coating.

In the hard coating of the eleventh basic configuration, the intermediate layer 3 has an average composition of (Al, Ti, Cr, Y, Mo)N as an entirety of the film. The intermediate layer 3 of the eleventh basic configuration constitutes an example of the intermediate layer 3 of the tenth basic configuration. The intermediate layer 3 of the tenth basic configuration is not limited thereto, and may have a film (layer) having a different composition from the lower layer 2 and the upper layer 4, for example.

Modified Example of Eleventh Basic Configuration

In the intermediate layer 3 of the eleventh basic configuration, each of the atomic proportions of Al, Ti, Cr, Y, and Mo may change in the film thickness direction, similarly to the intermediate layer 3 of the tenth basic configuration. Note that, when the Al atomic proportion in the lower layer 2 and the Al atomic proportion in the upper layer 4 are same, the Al atomic proportion in the intermediate layer 3 is uniform and does not change in the film thickness direction.

Summary of Twelfth Basic Configuration

A twelfth basic configuration of the hard coating includes: a lower layer 2 formed on a substrate 1; and an upper layer 4 formed on the lower layer 2, similarly to the schematic view of the third basic configuration described with reference to FIG. 4. The lower layer 2 has a composition composed of (Ti, Al, Mo)N, the upper layer has a composition composed of (Al, Ti, Cr, Y)N, and an atomic proportion of Y in Al, Ti, Cr, Y, Mo, and N contained in an entirety of the hard coating is smaller than 0.01.

The hard coating of the twelfth basic configuration includes the upper layer 4 having a composition composed of (Al, Ti, Cr, Y)N. Thus, the hard coating having a long lifetime and excellent wear resistance, heat resistance, low frictional and high sliding properties, welding resistance, adhesiveness, etc. can be obtained similarly to the first basic configuration.

Furthermore, the atomic proportion of Y in Al, Ti, Cr, Y, Mo, and N contained in an entirety of the hard coating is smaller than 0.01, and thereby the hard coating can exhibit excellent hardness and Young's modulus at not only room temperature but also high temperature similarly to the third basic configuration. In addition, Y hardly diffuses and permeates near an interface of the lower layer 2 with the substate 1, and the hard coating can keep the damage resistance of the lower layer 2.

Modified Example of Twelfth Basic Configuration

The hard coating may further comprise an intermediate layer 3 between the lower layer 2 and the upper layer 4, the intermediate layer 3 having a substantial composition composed of (Al, Ti, Cr, Y, Mo)N and having the composition between the composition of the upper layer 4 and the composition of the lower layer 2. Such an intermediate layer 3 may be composed of the intermediate layer 3 of the tenth and eleventh basic configurations and the modified examples thereof, for example.

Summary of Thirteenth Basic Configuration

In a thirteenth basic configuration of the hard coating, the composition of the upper layer 4 of the above tenth basic configuration, (Al, Ti, Cr, Y)N, is changed to (Al, Ti, Cr, Mo)N, (Al, Ti, Cr, V)N, (Al, Ti, Cr, Mo, V)N, (Al, Ti, Cr, Mo, Y)N, (Al, Ti, Cr, V, Y)N, or (Al, Ti, Cr, Mo, V, Y)N. That is, the upper layer 4 has a composition composed of (Al, Ti, Cr, Mo)N, (Al, Ti, Cr, V)N, (Al, Ti, Cr, Mo, V)N, (Al, Ti, Cr, Mo, Y)N, (Al, Ti, Cr, V, Y)N, or (Al, Ti, Cr, Mo, V, Y)N. The intermediate layer 3 has a substantial composition composed of (Al, Ti, Cr, Mo)N, (Al, Ti, Cr, Mo, V)N, (Al, Ti, Cr, Mo, Y)N, or (Al, Ti, Cr, Mo, V, Y)N and having the composition between the composition of the lower layer 2 and the composition of the upper layer 4.

In the intermediate layer 3, each of an atomic proportion of Al, an atomic proportion of Ti, and an atomic proportion Cr in the film thickness direction changes from a side of the lower layer 2 toward a side of the upper layer 4, similarly to the above tenth basic configuration. When the upper layer 4 has a composition of (Al, Ti, Cr, V)N, (Al, Ti, Cr, Mo, V)N, (Al, Ti, Cr, Mo, Y)N, (Al, Ti, Cr, V, Y)N, or (Al, Ti, Cr, Mo, V, Y)N, atomic proportions of V and Y in the intermediate layer 3 are larger as closer to the side of the upper layer 4. When a Mo atomic proportion in the lower layer 2 and a Mo atomic proportion in the upper layer 4 are different, a Mo atomic proportion in the intermediate layer 3 changes from the side of the lower layer 2 toward the side of the upper layer 4 in the film thickness direction so as to approach the Mo atomic proportion in the upper layer 4. On the other hand, when the Mo atomic proportion in the lower layer 2 and the Mo atomic proportion in the upper layer 4 are same, the Mo atomic proportion in the intermediate layer 3 is uniform in the film thickness direction and does not change. When the upper layer 4 is (Al, Ti, Cr, V)N or (Al, Ti, Cr, V, Y)N, the atomic proportion of Mo in the intermediate layer 3 is smaller as closer to the side of the upper layer 4.

In the hard coating of the thirteenth basic configuration, the upper layer 4 composed of (Al, Ti, Cr, Mo)N, (Al, Ti, Cr, V)N, (Al, Ti, Cr, Mo, V)N, (Al, Ti, Cr, Mo, Y)N, (Al, Ti, Cr, V, Y)N, or (Al, Ti, Cr, Mo, V, Y)N has extremely excellent wear resistance and oxidation resistance, and extremely high durability in an entirety of the hard coating, similarly to the upper layer 4 of the first basic configuration composed of (Al, Ti, Cr, Y)N. Therefore, the hard coating of the thirteenth basic configuration yields the action and effect same as the hard coatings of the first basic configuration and the tenth basic configuration.

Modified Example of Thirteenth Basic Configuration

In the thirteenth basic configuration, the atomic proportion of Al, the atomic proportion of Ti, and the atomic proportion of Mo in the film thickness direction in the intermediate layer 3 may change, similarly to the modified example of the tenth basic configuration. Such a modified example of the thirteenth basic configuration yields the action and effect same as of the modified example of the tenth basic configuration. Note that, in the intermediate layer 3 of the modified example of the thirteenth basic configuration, the atomic proportion of Al in the film thickness direction may be uniform, and the atomic proportion of Ti in the film thickness direction may be uniform.

In the thirteenth basic configuration, an increase rate of the atomic proportion of Cr in a half of the intermediate layer 3 on the side of the upper layer 4 may be larger than that in a half on the side of the lower layer 2. In addition, increase rates of the atomic proportions of Mo, V, and Y in the half of the intermediate layer 3 on the side of the upper layer 4 may be larger than those in a half on the side of the lower layer 2. These configurations allow the effect by Mo, V, and Y of keeping mechanical characteristics at high temperature to exhibit more as closer to the surface of the hard coating, and thereby the hard coating can exhibit excellent hardness and Young's modulus even at high temperature, and can exhibit excellent wear resistance even under a severer use environment.

Summary of Fourteenth Basic Configuration

A fourteenth basic configuration of the hard coating includes: a lower layer 2 formed on a substrate 1; an intermediate layer 3; and an upper layer 4, similarly to the eleventh basic configuration. The lower layer 2 has a composition composed of $(Ti_{1-x}Al_xMo_b)N$, and "x" and "b" each representing an atomic proportion satisfy $0.40 \le y \le 0.70$ and $0 < b \le 0.10$. The upper layer 4 has a composition composed of $(Al_{1-y-z-a}Ti_yCr_zM_a)N$, and "y", "z", and "a" each representing an atomic proportion satisfy $0 < y \le 0.45$, $0 < z \le 0.5$, and $0 < a \le 0.02$. Here, M represent one or more elements selected from Mo, V, and Y (when M represents Y, the basic configuration is the same configuration as the above eleventh basic configuration). The intermediate layer 3 is a film in which first intermediate films 3*a* having the same composition as the upper layer 4 and second intermediate films 3*b* having the same composition as the upper layer 4 are alternately stacked.

The hard coating of the fourteenth basic configuration includes the upper layer 4 having a composition composed of (Al, Ti, Cr, M)N, wherein M represents one or more elements selected from Mo, V, and Y. Thus, the hard coating having a long lifetime and excellent wear resistance, heat resistance, low frictional and high sliding properties, welding resistance, adhesiveness, etc. can be obtained similarly to the above first, fifth, tenth, and thirteenth basic configurations.

The upper layer 4 satisfies $0 < y \le 0.45$, $0 < z \le 0.5$, and $0 < a \le 0.02$ when the composition is represented by $(Al_{1-y-z-a}Ti_yCr_zM_a)N$, wherein M represents one or more elements selected from Mo, V, and Y. Thus, the hard coating can exhibit excellent hardness and Young's modulus at not only room temperature but also high temperature, and can exhibit excellent wear resistance even under a severer use environment. Here, $0.05 \le y \le 0.3$ is preferable, $0.15 \le z \le 0.5$ is preferable, and $0.005 \le a \le 0.01$ is preferable.

In the hard coating of the fourteenth basic configuration, the intermediate layer 3 has an average composition of (Al, Ti, Cr, Mo)N, (Al, Ti, Cr, Mo, V)N, (Al, Ti, Cr, Mo, Y)N, or (Al, Ti, Cr, Mo, V, Y)N as an entirety of the film. The intermediate layer 3 of the fourteenth basic configuration constitutes an example of the intermediate layer 3 of the thirteenth basic configuration. Note that the intermediate layer 3 in the thirteenth basic configuration is not limited thereto, and may have a film (layer) having different composition from the lower layer 2 and the upper layer 4, for example.

Summary of Fifteenth Basic Configuration

A fifteenth basic configuration of the hard coating is a hard coating formed on a substrate 1 and including: a lower layer 2 having a composition composed of (Ti, Al, Mo)N; and an upper layer 4 formed on the lower layer 2 and having a composition composed of (Al, Ti, Cr, M)N, wherein M represents one or more elements selected from Mo, V, and Y, and an atomic proportion of M in Al, Ti, Cr, Mo, M, and N contained in an entirety of the hard coating is smaller than 0.01.

The hard coating of the third basic configuration includes the upper layer 4 having a composition composed of (Al, Ti, Cr, M)N, wherein M represents one or more elements selected from Mo, V, and Y. Thus, the hard coating having a long lifetime and excellent wear resistance, heat resistance, low frictional and high sliding properties, welding resistance, adhesiveness, etc. can be obtained similarly to the first, fifth, tenth, and thirteenth basic configurations.

Furthermore, the atomic proportion of M (one or more elements selected from Mo, V, and Y) in Al, Ti, Cr, Mo, M, and N contained in an entirety of the hard coating is smaller than 0.01, and thereby the hard coating can exhibit excellent hardness and Young's modulus at not only room temperature but also high temperature, and can exhibit excellent wear resistance even under a severer use environment similarly to the third and twelfth basic configurations. In addition, Mo, V, and Y in the upper layer 4 hardly diffuse and permeate near an interface of the lower layer 2 with the substate 1, and the hard coating can keep the damage resistance of the lower layer 2. Thus, the hard coating can exhibit excellent characteristics without peeling from the substrate even under a use environment with applied higher load and large impact to easily cause damage, chipping, etc. of the hard coating.

Note that the aforementioned basic configurations and each configuration described in the modified examples (notes, etc.) may be combined, and addition, omission, substitution, and other modifications of configurations can be made. For example, the aforementioned fourth basic configuration may be combined with the tenth to fifteenth basic configurations.

Example 1

Hereinafter, a first Example will be described with reference to the drawings. First, a configuration of a hard coating of the present Example will be described with reference to FIG. 1. The present Examples is not limited to the above first basic configuration.

As illustrated in FIG. 1, the lower layer 2 has the composition represented by (Til-xAlx)N, and formed on the substrate 1 with 1 to 8 μm in thickness. "x" represents an atomic proportion, and satisfies $0.4 \le x \le 0.70$.

The upper layer 4 has the composition represented by (All-y-z-aTiyCrzYa)N, and having a thickness of 1 to 8 μm. "y", "z", and "a" each represents an atomic proportion, and satisfy $0 < y \le 0.45$, $0 < z \le 0.5$, and $0 < a \le 0.02$.

The intermediate layer 3 is formed between the lower layer 2 and the upper layer 4 with 1 to 5 μm in thickness. The intermediate layer 3 has a composition between the composition of the lower layer 2 and the composition of the upper layer 4. The intermediate layer 3 is preferably a film in which films having the same composition as the lower layer 2 and films having the same composition as the upper layer 4 are alternately stacked with a stacking period of 1 to 100 nm.

Figure 7:
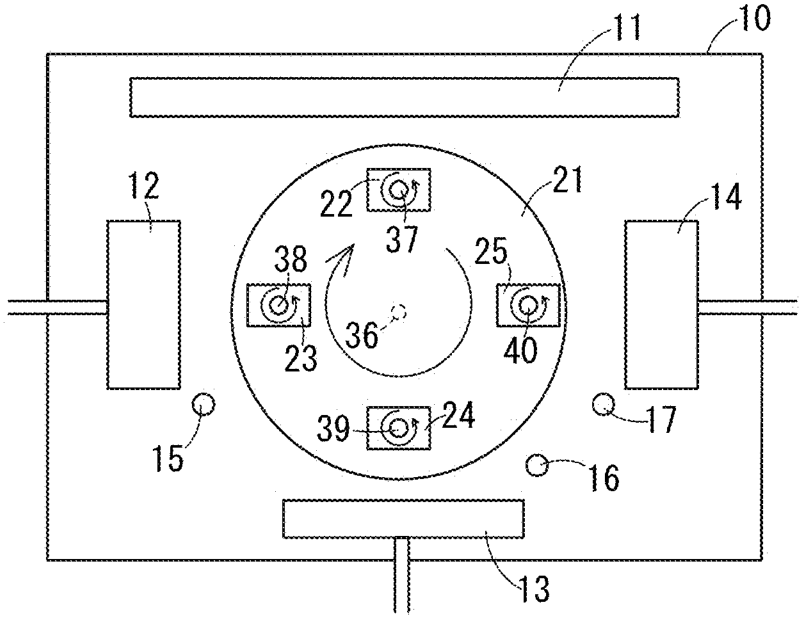
FIG. 7 is a plane view illustrating a schematic configuration of an example of an apparatus for forming a hard coating.
Figure 8:
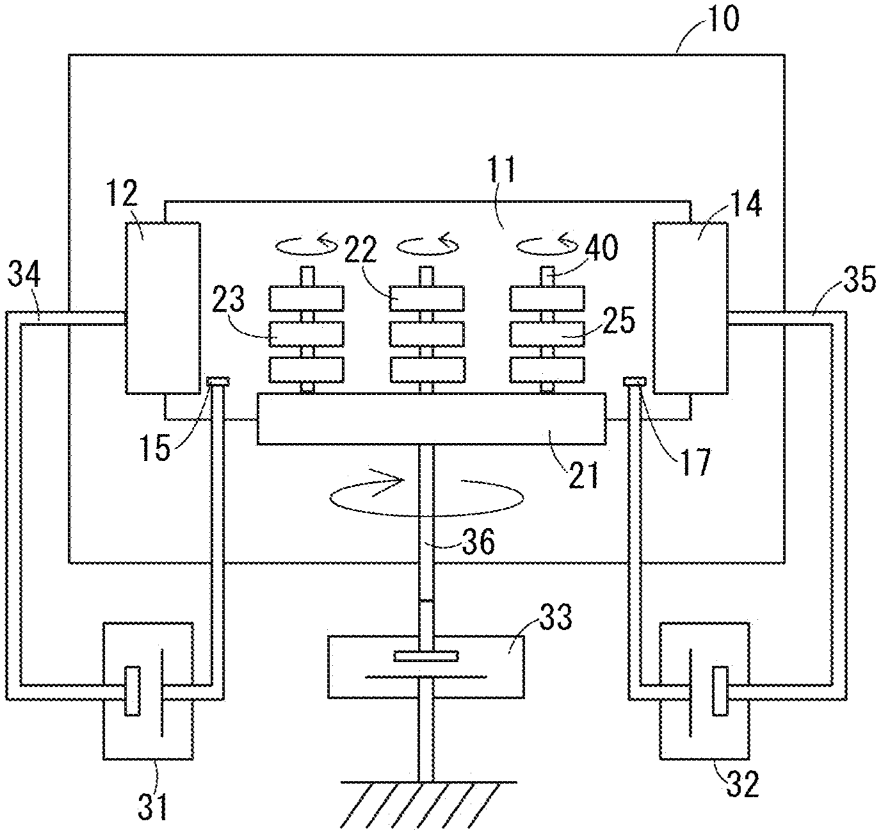
FIG. 8 is a front view illustrating a schematic configuration of an example of the apparatus for forming a hard coating.

Next, a method for forming such a hard coating will be described. FIG. 7 is a plane view illustrating a cathode arc-ion plating film-forming apparatus used for forming the hard coating of the present Example, and FIG. 8 is a front view thereof. In the present Example, arc-ion plating using two cathodes forms two types of films on the substrate.

Evacuation can be made in a chamber 10, and furthermore, a reactive gas such as Ar gas or N2 gas can be introduced into the chamber 10. By introducing the reactive gas under evacuation, inside of the chamber 10 can be filled with the reactive gas under a predetermined reduced pressure.

In the chamber 10, a table 21 is supported on a rotation axis 36 extending in a vertical direction. The table 21 is rotationally driven by an appropriate driving source (not illustrated) via the rotation axis 36. On the table 21, rotation axes 37, 38, 39, and 40 extending in the vertical direction are disposed on four equivalently arranged positions on a circle with the rotation axis 36 as the center. The rotation axes 37 to 40 rotate with planetary gears to which the rotation axis 36 is attached as a sun gear. A plurality of substrates 22, 23, 24, and 25 is attached to each of the rotation axes 37 to 40. The substrates 22 to 25 rotate around the rotation axes 37 to 40, and revolves around the rotation axis 36.

Around the table 21, a heater 11, a first cathode 12 as a first evaporation source, a third cathode 13 as a bombard washing source 13, and a second cathode 14 as a second evaporation source are disposed counterclockwise in a plane view with a substantially equal interval. The heater 11 heats the substrates 22 to 25.

The first cathode 12 for forming one of the two types of films to be formed on the substrates 22 to 25, and the second cathode 14 for forming the other film are provided on positions opposite to each other across the rotation axis 36. Between the first cathode 12 and the second cathode 14, the third cathode 13 for bombard washing is disposed. As the third cathode 13, metal Ti is typically used.

Near lower ends of the cathodes 12, 13, and 14, anodes 15, 16, and 17 are disposed respectively. Between the first anode 15 and the first cathode 12, a first arc power source 31 is connected via a lead 34. Between the second anode 17 and the second cathode 14, a second arc power source 32 is connected via a lead 35. Between the third cathode 13 and the third anode 16, an arc power source (not illustrated) is also connected. A bias power source 33 for applying a negative bias voltage to the substrates 22 to 25 is connected to the table 21. The chamber 10 is provided with an introducing port for process gas and a discharging port for evacuation (both are not illustrated).

Next, operation of the cathode arc-ion plating film-forming apparatus constituted as above will be described. For example, a TiAl target is set to the first cathode 12 as the first evaporation source, and an AlTiCrY target is set to the second cathode 14 as the second evaporation source. Here, when a composition of the TiAl target is represented by Til-xAlx, "x" representing an atomic proportion satisfies $0.4 \le x \le 0.70$. When a composition of the AlTiCrY target is represented by All-y-z-aTiyCrzYa, "y", "z", and "a" each representing an atomic proportion satisfy $0 < y \le 0.45$, $0 < z \le 0.5$, and $0 < a \le 0.02$.

The substrates 22 to 25 chemically washed and then dried are set on the rotation axes 37 to 40. The substrates 22 to 25 are, for example, SKD 11 steel plates having a plate shape in 25 mm×25 mm square and 7 mm in thickness. This substrate is a quenched material with a hardness of 60HRC. This substrate was surface-polished to Ra=0.01 to 0.02 μm.

The inside of the chamber 10 is evacuated to a base pressure of, for example, 1×10−3 Pa, and the table 21 is rotationally driven to rotationally drive the rotation axes 37 to 40 on the table 21. According to these procedures, the substrates 22 to 25 supported on the rotation axes 37 to 40 revolve with the table 21, and rotate on the table 21. The substrates 22 to 25 on the table 21 are heated to a temperature of, for example, 450° C. by supplying current to the heater 11. Since the substrates 22 to 25 rotate and revolve, the substrates 22 to 25 are uniformly heated by the heater 11.

Thereafter, the bombard step is subsequently performed. Ar gas at 1 Ps is introduced inside the chamber 10, a bias voltage at −300 V is applied at a substrate temperature of 450° C., and this condition is retained for 60 minutes while rotating the table 21 at, for example, 1 rpm. Alternatively, Ti, Cr, or TiAl is set to the third cathode 13 as a metal for bombard, a bias voltage of 31 1000 V is applied to the table 21 by the bias power source 33 in the vacuum at high temperature to apply a current of 100 A to the third cathode 13 by the arc power source, and this condition is retained for 1 to 5 minutes. This ion-bombard process cleans the surfaces of the substrates 22 to 25.

Thereafter, a deposition step is subsequently performed. First, N2 gas at 4 Pa is introduced inside the chamber 10. Then, a cathode current of, for example, 100 A is supplied to the first cathode 12 to which the TiAl target is set. In this time, a bias voltage of, for example, −50 V is applied to the substrates 22 to 25 by the bias power source 33. This step forms the lower layers 2 composed of a (Ti, Al)N deposition film on the substrates 22 to 25. For example, the lower layer 2 is formed with a film thickness of 1.5 μm.

While retaining the supplying of the cathode current to the first cathode 12 and applying of the bias voltage to the substrates 22 to 25, a cathode current of, for example, 120 A is supplied to the second cathode 14. As above, the two types of targets opposite to each other are simultaneously discharged while rotating the substrates 22 to 25 on which the lower layer 2 is formed, first intermediate films 3*a* composed of (Al, Ti, Cr, Y)N films and second intermediate films 3*b* composed of (Ti, Al)N films are alternately formed on the lower layer 2 as illustrated in FIG. 3, and the intermediate layer 3 is formed as a whole. For example, the intermediate layer 3 is formed with a film thickness of 1.5 μm.

While retaining the applying of the bias voltage to the substrates 22 to 25, the cathode current to the first cathode 12 is set to zero, and the cathode current to the second cathode 14 is set to, for example, 140 A. This procedure forms the upper layer 4 composed of an (Al, Ti, Cr, Y)N film on the intermediate layer 3. For example, the upper layer 4 is formed with a film thickness of 1 μm.

In the arc-ion plating of the present embodiment, the negative voltage is applied to the cathodes 12 and 14 to generate the arc discharge between the anodes 15 and 16. This arc discharge forms an arc spot on the surface of the TiAl target set to the first cathode 12 or on the surface of the AlTiCrY target set to the second cathode 14, and the arc spot randomly runs on the target surface. The target material is instantly evaporated by energy of the arc current concentrated at the arc spot, and the target material becomes metal ions (positive ions) to be released into vacuum. The released metal ions are deposited to form a film on the surfaces of the substrates 22 to 25 being a material to be coated (die, cutting tool, machine part, etc.). In this time, the negative bias voltage is applied to the substrates 22 to 25, and thereby the metal ions (positive ions) in vacuum are accelerated to fly toward the substrates 22 to 25 by an electrically attractive force, and collide with the surfaces of the substrates 22 to 25 together with reactive gas particles with high energy. This procedure forms a hard coating in a state of adhering to the surfaces of the substrates 22 to 25 to generate the dense hard coating.

The amount of the metal ions released from the target and the speed of the metal ions to collide with the surfaces of the substrates 22 to 25 can be changed by changing the magnitude of the arc current supplied to the cathodes 12 and 14 and by changing the magnitude of the bias voltage applied to the substrates 22 to 25.

For example, setting magnitude of the arc currents to the first cathode 12 and the second cathode 14 to be different in the step of forming the intermediate layer 3 can set the thicknesses of the first intermediate film 3*a* and the second intermediate film 3*b* to be different. This difference can design the average composition of the bilayer film composed of one of the first intermediate films 3*a* and one of the second intermediate films 3*b* adjacent to each other to be a desired composition between the composition of the TiAl target and the composition of the AlTiCrY target.

In addition, in the step of forming the intermediate layer 3, the intermediate layer 3 in which atomic proportions of Al, Ti, Cr, and Y change in the film thickness direction can be formed by changing the magnitude of the arc current supplied to the cathodes 12 and 14 or by changing the magnitude of the bias voltage applied to the substrates 22 to 25 between the lower side (side of the lower layer 2) and the upper side (side of the upper layer 4) in the intermediate layer 3. For example, the intermediate layer 3 having a composition in which each of the atomic proportion of Cr and the atomic proportion of Y is larger as closer to the side of the upper layer 4 in the film thickness direction can be formed by stepwise or continuous raising of the magnitude of the arc current supplied to the first cathode 12 supporting the AlTiCrY target in forming the intermediate layer 3. In forming the intermediate layer 3 on the upper side (the side of the upper layer 4), a degree of the stepwise or continuous raising of the magnitude of the arc current supplied to the first cathode 12 may be larger than that in forming the intermediate layer 3 on the lower side (side of the lower layer 2). This setting allows each of an increase rate of the atomic proportion of Cr and an increase rate of the atomic proportion of Y in the film thickness direction in a half of the intermediate layer 3 on the side of the upper layer 4 to be larger than those in a half on the side of the lower layer 2.

Example 2

Hereinafter, a second Example will be described with reference to the drawings. First, a configuration of a hard coating of the present Example will be described with reference to FIG. 5. The present Example is not limited to the above tenth basic configuration.

As illustrated in FIG. 5, the lower layer 2 has the composition represented by (Til-xAlxMob)N, and formed with 1 to 8 μm in thickness on the substrate 1. "x" and "b" each represents an atomic proportion, and satisfy $0.4 \leq x \leq 0.70$ and $0 < b \leq 0.10$.

The upper layer 4 has a composition represented by (All-y-z-aTiyCrzYa)N, and has a thickness of 1 to 8 μm. "y", "z", and "a" each represents an atomic proportion, and satisfy $0 < y \leq 0.45$, $0 < z \leq 0.5$, and $0 < a \leq 0.02$.

The intermediate layer 3 is formed between the lower layer 2 and the upper layer 4 with 1 to 5 μm in thickness. The intermediate layer 3 has the composition between the composition of the lower layer 2 and the composition of the upper layer 4. The intermediate layer 3 is preferably a film in which films having the same composition as the lower layer 2 and films having the same composition as the upper layer 4 are alternately stacked with a stacking period of 1 to 100 nm.

Such a hard coating was formed in the same manner as the method for forming the hard coating of the above first Example described with reference to FIG. 7 and FIG. 8. Here, described is an example in which a TiAlMo target is set to the first cathode 12 as the first evaporation source and an AlTiCrY target is set to the second cathode 14 as the second evaporation source. When a composition of the TiAlMo target is represented by Til-xAlxMob, "x" and "b" each representing an atomic proportion satisfy $0.4 \leq x \leq 0.70$ and $0 < b \leq 0.10$. When a composition of the AlTiCrY target is represented by Al1-y-z-aTiyCrzYa, "y", "z", and "a" each representing an atomic proportion satisfy $0 < y \leq 0.45$, $0 < z \leq 0.5$, and $0 < a \leq 0.02$.

The hard coating of the second Example was formed in the same manner as the method for forming the hard coating of the first Example. The bombard process is performed, and then a cathode current of, for example, 100 A is supplied to the first cathode 12 on which the TiAlMo target is set, and a bias voltage of, for example, −50 V is applied to the substrates 22 to 25 by the bias power source 33. This procedure forms the lower layer 2 composed of a (Ti, Al, Mo)N deposition film on the substrates 22 to 25 with a film thickness of, for example, 1.5 μm.

While retaining the supplying of the cathode current to the first cathode 12 and applying of the bias voltage to the substrates 22 to 25, a cathode current of, for example, 120 A is supplied to the second cathode 14 to alternately form first intermediate films 3*a* composed of (Al, Ti, Cr, Y)N films and second intermediate films 3*b* composed of (Ti, Al, Mo)N films on the lower layer 2 as illustrated in FIG. 3, and the intermediate layer 3 is formed as a whole. For example, the intermediate layer 3 is formed with a film thickness of 1.5 μm.

While retaining the applying of the bias voltage to the substrates 22 to 25, the cathode current to the first cathode 12 is set to zero, and the cathode current to the second cathode 14 is set to, for example, 140 A. This procedure forms the upper layer 4 composed of an (Al, Ti, Cr, Y)N film on the intermediate layer 3. For example, the upper layer 4 is formed with a film thickness of 1 μm.

Also, in the method for forming the hard coating of the second Example, the amount of the metal ions released from the target and the speed of the metal ions to collide with the surfaces of the substrates 22 to 25 can be changed by changing the magnitude of the arc current supplied to the cathodes 12 and 14 and by changing the magnitude of the bias voltage applied to the substrates 22 to 25, similarly to the forming method in the first Example.

For example, setting the magnitude of the arc currents to the first cathode 12 and the second cathode 14 to be different in the step of forming the intermediate layer 3 can set the thicknesses of the first intermediate film 3*a* and the second intermediate film 3*b* to be different. This difference can design the average composition of the bilayer film composed of one of the first intermediate films 3*a* and one of the second intermediate films 3*b* adjacent to each other to be a desired composition between the composition of the TiAlMo target and the composition of the AlTiCrY target.

In the step of forming the intermediate layer 3, the intermediate layer 3 in which atomic proportions of Al, Ti, Cr, Y, and Mo change in the film thickness direction can be formed by changing the magnitude of the arc current supplied to the cathodes 12 and 14 or by changing the magnitude the bias voltage applied to the substrates 22 to 25 between the lower side (side of the lower layer 2) and the upper side (side of the upper layer 4) in the intermediate layer 3. For example, the intermediate layer 3 having a composition in which each of the atomic proportion of Cr and the atomic proportion of Y is larger as closer to the side of the upper layer 4 in the film thickness direction and in which the atomic proportion of Mo is smaller as closer to the side of the upper layer 4 in the film thickness direction can be formed by stepwise or continuous raising of the magnitude of the arc current supplied to the first cathode 12 supporting the AlTiCrY target in forming the intermediate layer 3.

Evaluation of Hard Coating

A plurality of the hard coatings of the first Example and a plurality of the hard coatings of the second Example obtained as above exhibited a hardness of approximately 33 to 35 GPa at room temperature, and exhibited a hardness of approximately 32 GPa even after a heating treatment at 900° C. (nano-indenter ENT-1100 (available from ELIONIX INC), test load: 30 mN). On the other hand, a conventional TiN coating and (Al, Ti)N coating exhibited a hardness of approximately 25 to 32 GPa at room temperature. However, the conventional coatings were oxidized by performing the heating treatment at 900° C., and failed to keep their structure. The hard coatings of first and second Examples keep their coatings even by performing the heating treatment at 900° C., and the coatings are hardly peeled, and have improved heat resistance compared with the conventional coatings.

The hard coatings of the first and second Examples, and the TiN coating and the (Ti, Al)N coating (conventional coatings) were indented with a diamond indenter on the coating, and the adhesiveness was evaluated from a peeling state of the film (Rockwell durometer (ARK-F1000 (available from Akashi Corporation)), test load: 150 kg). On the hard coatings of the first and second Examples, only cracking was observed around the indentation, and no film peeling was observed, which indicated good adhesiveness (judgement result HF1 (VDI3198 standard)). Meanwhile, on the conventional coatings, film peeling was observed around an entire circumference of the indentation, which indicated not good adhesiveness (judgement result HF6). As above, the hard coatings of the first and second Examples have better adhesiveness than the conventional coatings.

Frictional coefficients of the hard coatings of the first and second Examples and the (TiAl)N coating (conventional coating) were measured (TRIBOGEAR TYPE: 14FW (available from SHINTO Scientific Co., Ltd.), sliding rate: 600 m/min, sliding length: 10 mm, load: 300 g, number of sliding: 100 (reciprocation), counter material: SUJ2 ball (6 mm), measurement temperature: 700° C.). The conventional coating exhibited a frictional coefficient of as low as 0.23 to 0.37 in the initial measurement (the 1st time), but repeated sliding generated wear powder, and exhibited a frictional coefficient of as high as 0.67 to 0.74 in the terminal measurement (the 100th time). On the other hand, the hard coatings of the first and second Examples exhibited a frictional coefficient of 0.41 to 0.70, which was higher than that of the conventional coating, in the initial measurement, but wear powder was not generated even with repeated sliding. The hard coatings of the first and second Examples exhibited a frictional coefficient of 0.61 to 0.67 in the terminal measurement, which was not so high compared with the frictional coefficient in the initial measurement (the frictional coefficients were lowered with some samples). As above, the hard coatings of the first and second Examples have good wear resistance, low frictional and high sliding properties, and welding resistance compared with the conventional coating.

As above, the hard coatings of the first and second Examples exhibited excellent wear resistance, heat resistance, low frictional and high sliding properties, welding resistance, and adhesiveness compared with the conventional TiN coating and (Ti, Al)N coating.

Of the obtained hard coating of the first Example, orientation was evaluated by X-ray diffraction analysis. An X-ray output of the X-ray diffraction apparatus was 9 KW (45 kV, 200 mA), the used target was Cu, and a measurement angle was 20 to 80°. The substrate was SKD 11 in 25 mm square and 7 mm in thickness. This substrate had a hardness of 60HRC, and the surface was mirror-polished with Ra=0.01 to 0.02 μm. On this substrate, the hard coating was formed with a total film thickness of 8 μm to perform the X-ray diffraction analysis.

Figure 9:
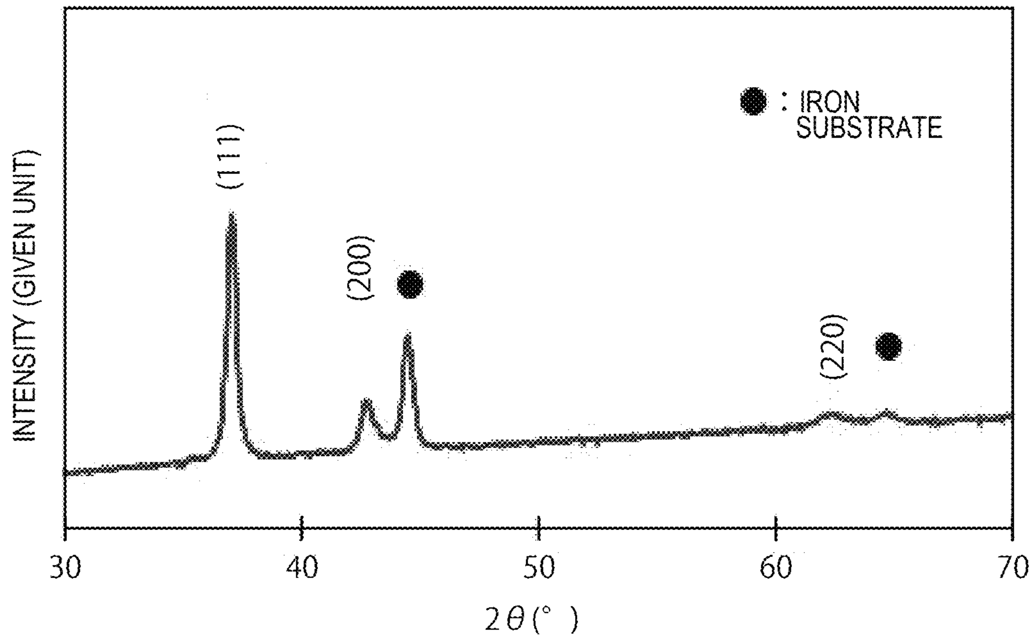
FIG. 9 is a graph showing a result of X-ray diffraction analysis of a hard coating.

FIG. 9 shows the X-ray diffraction analysis results of the obtained hard coating. In FIG. 9, the vertical axis represents an intensity of the diffraction X-ray (given unit), and the horizontal axis represents a diffraction angle 2θ (degree). As shown in this FIG. 9, peaks appear at (111), (200), and (220). From this figure, (111) orientation is determined with a formula of I(111)/{I(111)+I(200)+I(220)}. Note that I(111), I(200), and I(220) represent peak intensities of (111), (200), and (220), respectively. As shown in FIG. 9, a diffraction line peak from the substrate appears, and thereby it is found that the region of the X-ray diffraction is an entire region in the thickness direction of the hard coating.

The orientation of the obtained hard coating was evaluated by the X-ray diffraction analysis, and consequently found that the (111)/{(111)+(200)+(220)} orientation (referred to as "(111) orientation") was 50% or more in the entire coating. The (111)—oriented coating has high coating strength specifically in the lateral direction (direction parallel to the surface) when a strong shearing stress is applied, and exhibits durability.

The embodiments have been described above, but the present invention can be embodied into various aspects, not limited to the aforementioned embodiments. The constituent of each portion is not limited to the embodiments illustrated in the drawings, and various modifications can be made within a range not departing from the spirit of the present invention. Within a range not departing from the spirit of the present invention, each configuration described in the aforementioned embodiments and modified examples (the notes, etc.) may be combined, and addition, omission, substitution, and other modifications of the configurations can be made. The present invention is not limited by the aforementioned embodiments.

The invention claimed is:

1. A hard coating, comprising:

a lower layer having a composition composed of (Ti, Al) N;

an intermediate layer formed on the lower layer; and an upper layer formed on the intermediate layer and having a composition composed of (Al, Ti, Cr, M) N, wherein the M represents one or more elements selected from Mo, V, and Y, the intermediate layer has a substantial composition composed of (Al, Ti, Cr, M) N and has the composition between the composition of the lower layer and the composition of the upper layer, each of an atomic proportion of Al, and an atomic proportion of Ti changes in a film thickness direction from a side of the lower layer toward a side of the upper layer, and each of an atomic proportion of Crj, and an atomic proportion of M is larger as closer to the side of the upper layer in the film thickness direction, and the intermediate layer is a film in which films having a same composition as the upper layer and films having a same composition as the lower layer are alternately stacked.

2. The hard coating according to claim 1, wherein when the composition of the upper layer is represented by (Al1-y-z-aTiyCrzMa) N, "y", "z", and "a" each representing an atomic proportion satisfy $0<y\leq 0.45$, $0<z\leq 0.5$, and $0<a\leq 0.02$, and when the composition of the lower layer is represented by (Til-xAlx) N, "x" representing an atomic proportion satisfy $0.4\leq x\leq 0.70$.

3. The hard coating according to claim 2, wherein the M represents Y.

4. A hard coating, comprising:

a lower layer having a composition composed of (Ti, Al)N;

an intermediate layer formed on the lower layer; and an upper layer formed on the intermediate layer and having a composition composed of (Al, Ti, Cr, M) N, wherein the M represents one or more elements selected from Mo, V, and Y, the intermediate layer has a substantial composition composed of (Al, Ti, Cr, M) N and has the composition between the composition of the lower layer and the composition of the upper layer, each of an atomic proportion of Al, and an atomic proportion of Ti changes in a film thickness direction from a side of the lower layer toward a side of the upper layer, and each of an atomic proportion of Cr, and an atomic proportion of M is larger as closer to the side of the upper layer in the film thickness direction, and the atomic proportion of Al in the intermediate layer increases from the side of the lower layer toward the side of the upper layer in the film thickness direction.

5. The hard coating according to claim 4, wherein an increase rate of the atomic proportion of Al in a half of the intermediate layer on the side of the upper layer is larger than that in a half on the side of the lower layer.

6. A hard coating, comprising:

a lower layer having a composition composed of (Ti, Al)N;

an intermediate layer formed on the lower layer; and an upper layer formed on the intermediate layer and having a composition composed of (Al, Ti, Cr, M) N, wherein the M represents one or more elements selected from Mo, V, and Y, the intermediate layer has a substantial composition composed of (Al, Ti, Cr, M) N and has the composition between the composition of the lower layer and the composition of the upper layer, each of an atomic proportion of Al, and an atomic proportion of Ti, changes in a film thickness direction from a side of the lower layer toward a side of the upper layer, and each of an atomic proportion of Cr, and an atomic proportion of M is larger as closer to the side of the upper layer in the film thickness direction, and the lower layer has a composition of (Ti, Al) N, and when the composition is represented by (Til-xAlx) N, "x" representing an atomic proportion satisfies 0.4≤x≤0.70.

7. The hard coating according to claim 6, wherein an increase rate of the atomic proportion of M in a half of the intermediate layer on the side of the upper layer is larger than that in a half on the side of the lower layer.

* * * * *